US007120893B2

(12) United States Patent
Sasaki et al.

(10) Patent No.: US 7,120,893 B2
(45) Date of Patent: Oct. 10, 2006

(54) SYSTEM AND METHOD FOR EVALUATION OF ELECTRIC CHARACTERISTICS OF PRINTED-CIRCUIT BOARDS

(75) Inventors: Hideki Sasaki, Tokyo (JP); Takashi Harada, Tokyo (JP)

(73) Assignee: NEC Corporation, Tokyo (JP)

( * ) Notice: Subject to any disclaimer, the term of this patent is extended or adjusted under 35 U.S.C. 154(b) by 633 days.

(21) Appl. No.: 10/291,539

(22) Filed: Nov. 12, 2002

(65) Prior Publication Data

US 2003/0084415 A1 May 1, 2003

Related U.S. Application Data

(62) Division of application No. 09/551,838, filed on Apr. 18, 2000, now Pat. No. 6,546,528.

(30) Foreign Application Priority Data

Apr. 21, 1999 (JP) ................................. 11-114200

(51) Int. Cl.
*G06F 17/50* (2006.01)
(52) U.S. Cl. .................. 716/15; 716/4; 716/5; 716/10; 716/11
(58) Field of Classification Search .............. 716/1, 716/4–5, 10–11, 15; 703/18; 361/818
See application file for complete search history.

(56) References Cited

U.S. PATENT DOCUMENTS 5,341,274 A 8/1994 Nakatani et al.
6,215,373 B1 4/2001 Novak et al.

FOREIGN PATENT DOCUMENTS

JP 7-152824 6/1995

(Continued)

OTHER PUBLICATIONS

T. Harada, H. Sasaki & Y. Kami, "Radiated Emission Arising from Power Distribution in Multilayer Printed Circuit Boards", *International Symposium on Electromagnetic Compatibility*, IEEE, Aug. 1997, p. 518-522.

(Continued)

*Primary Examiner*—Paul Dinh
(74) *Attorney, Agent, or Firm*—Whitham, Curtis, Christofferson & Cook, PC

(57) ABSTRACT

A printed-circuit board characteristic evaluation system is basically configured by an input device, a data processing device, a storage device and an output device. Herein, the input device inputs layout information representing an overall layout of a printed-circuit board installing at least one active component, from which layout information data regarding a power supply circuit is extracted and is stored in the storage device. The layout information data is converted to electric circuit information representing an equivalent circuit model with respect to a selected side of the printed-circuit board. Then, calculations are performed based on the layout information data to produce impedance characteristics with respect to the power supply circuit. A decision is made as to whether resonance is caused to occur in the power supply circuit on the basis of results of comparison of the impedance characteristics. The output device outputs the impedance characteristics as well as resonance information. If it is determined that resonance is caused to occur in the power supply circuit, the system changes the layout information, from which new layout information data is being extracted. In addition, a resonance suppression technique (e.g., installation of a decoupling capacitor) is applied to a certain point of the power supply circuit or a prescribed power terminal connecting position. Thus, the system is capable of performing evaluation as to whether printed-circuit boards are well designed to suppress variations of power voltages while inhibiting radiation of unwanted electromagnetic waves from occurring due to resonance of power supply circuits.

2 Claims, 20 Drawing Sheets

FOREIGN PATENT DOCUMENTS

| | | |
|---|---|---|
| JP | 7-239865 | 9/1995 |
| JP | 7-120368 | 12/1995 |
| JP | 9-266370 | 10/1997 |
| JP | 9-274623 | 10/1997 |
| JP | 9-325976 | 12/1997 |
| JP | 10-97560 | 4/1998 |
| JP | 10-105583 | 4/1998 |
| JP | 10-269277 | 10/1998 |
| JP | 10-301976 | 11/1998 |
| JP | 11-15870 | 1/1999 |
| JP | 11-94889 | 4/1999 |
| JP | 11-120214 | 4/1999 |
| JP | 2000-22287 | 1/2000 |
| JP | 2000-105777 | 4/2000 |
| JP | 2000-123062 | 4/2000 |

OTHER PUBLICATIONS

T. Harada, H. Sasaki & Y. Kami, "Investigation on Power Distribution Plane Resonance in Multilayer Printed Circuit Boards Using a Transmission-line Model", *International Symposium on Electromagnetic Compatibility*, IEEE, May 1999, p. 24-24.

T. Harada, H. Sasaki & Y. Kami, "Controlling Power-Distribution-Plane Resonance in Multilayer Printed Circuit Boards", *IEICE Transactions on Communications*, vol. E83-B, No. 3, Mar. 2000, p. 577-585.

T. Harada, K. Asao, H. Sasaki & Y. Kami, "Two-Dimensional Analysis for Power Distribution Plane in Multilayer Printed Circuit Boards", *IEICE Technical Report*, vol. 99, No. 102, Dec. 1999, p. 7-14.

Nikkei Electronics, 1998, No. 714, p. 151-158.

T. Harada, H. Sasaki & Y. Kami, "Analysis of Power Distribution Resonance in Multilayer Printed Circuit Boards Using the Transmission Line Theory", *Thesis of Microelectronics Symposium, Electronics Mounting Conference*, Dec. 1998, p. 105-108.

M. Montrose, "EMC Design for Printed Circuit", Ohm Corp., 1997, vol. 1, No. 1, p. 65-67.

T. Harada, H. Sasaki, K. Erikawa & Y. Kami, "Resonant Characteristics of Power Distribution Planes in Multilayer Printed Circuit Boards", *IEICE Technical Report*, vol. 98, No. 285, p. 47-52.

W. Banzhaf, "Simulating Lossy Transmission Lines with PSpice", on pp. 25-27 of RF Design, Jan. 1993.

Paper of Proceedings of the IEEE on pp. 1611-1612, vol. 65, No. 11, published on Nov. 1977.

R. Pucel et al., "Losses in Microstrip", IEEE Transactions on Microwave Theory and Techniques, vol. MTT-16, No. 6, Jun. 1968.

(S13)

↓

| CALCULATE IMPEDANCE $|Z_c'|$ OF DECOUPLING CAPACITOR BEING CONNECTED IN MOST PROXIMITY TO POSITION FOR CONNECTING POWER TERMINAL OF ACTIVE COMPONENT ON BOARD | — S25 |

↓

CALCULATE IMPEDANCE $|Z_{in2}|$ OF POWER SUPPLY CIRCUIT BEING CONNECTED TO FOLLOW DECOUPLING CAPACITOR — S26

↓

COMPARE $|Z_c'|$ AND $|Z_{in2}|$ — S27

↓

DISPLAY COMPARISON RESULT — S28

↓

END

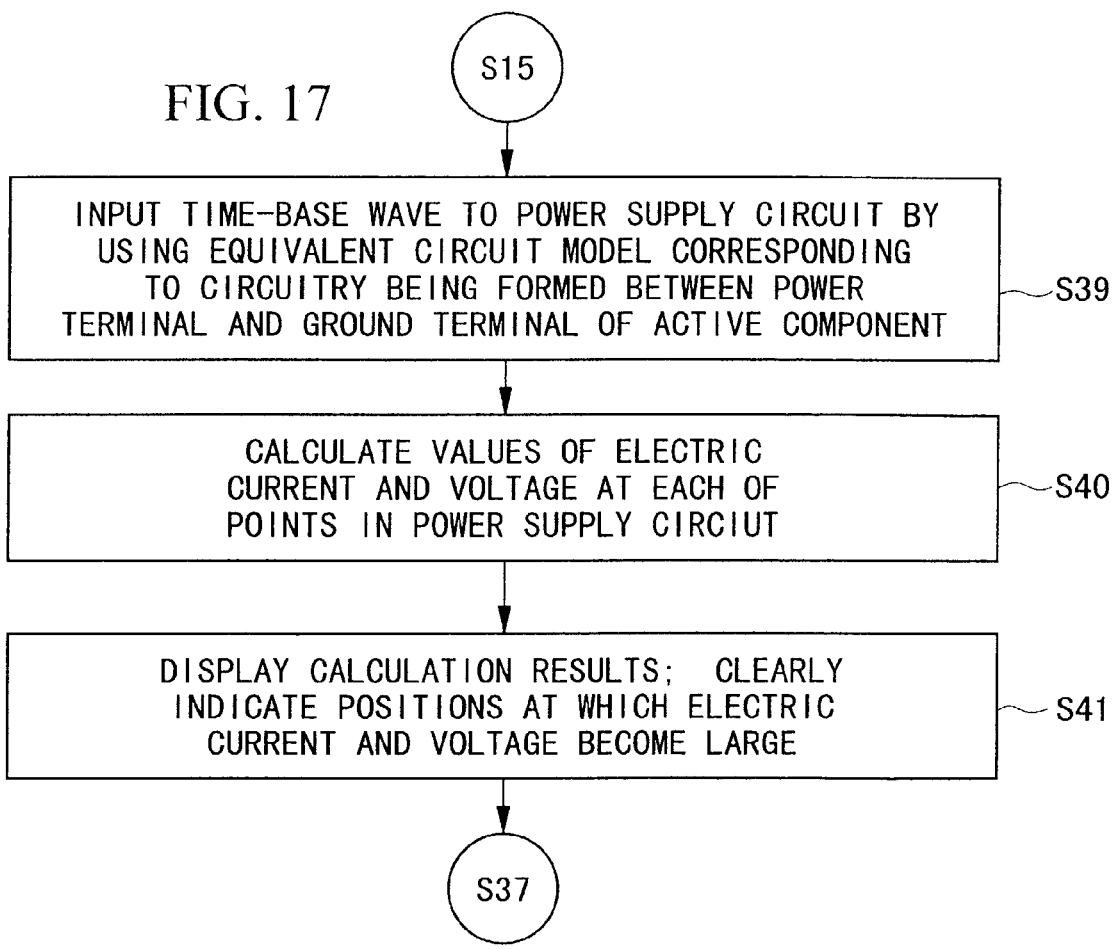

SYSTEM AND METHOD FOR EVALUATION OF ELECTRIC CHARACTERISTICS OF PRINTED-CIRCUIT BOARDS

This application is a division of U.S. patent application Ser. No. 09/551,838, filed Apr. 18, 2000 now U.S. Pat. No. 6,546,528, which claims benefit of priority of Japanese Patent Application 11-114200, filed Apr. 21, 1999.

BACKGROUND OF THE INVENTION

1. Field of the Invention

This invention relates to systems and methods that perform evaluation on electric characteristics of printed-circuit boards in accordance with numerical analysis. In addition, this invention also relates to storage media storing programs and data that actualize evaluation of the electric characteristics of the printed-circuit boards.

This application is based on Patent Application No. Hei 11-114200 filed in Japan, the content of which is incorporated herein by reference.

2. Description of the Related Art

Conventionally, engineers propose a variety of techniques that perform evaluation using numerical analysis as to whether printed-circuit boards operate normally or not. One of those techniques generally known corresponds to a circuit simulator called "PSPICE" (where "SPICE" is an abbreviation for "Simulation Program with Integrated Circuit Emphasis", which is developed by the University of California at Berkeley), an example of which is described on pp. 25–27 of RF Design published on January of 1993. Another example of the circuit simulator is disclosed by Japanese Unexamined Patent Publication No. Hei 9-274623, which aims at improvement of accuracy and reduction of number of steps for simulation of transmission lines in upstream stages of designs of electric circuits fabricated on boards.

The content of the aforementioned publication will be described in detail with reference to FIG. 23, which is a block diagram showing a configuration of a transmission-line simulator.

The transmission-line simulator of FIG. 23 operates as follows:

At first, there are provided components of electric circuits, which are being symbolized. The symbolized components (or component symbols) and their connection (or wiring pattern) are input to a display controller 101, so that a display 102 shows on a screen a physical shape and wiring topology with regard to a board on which the components are interconnected together in accordance with the connection. The display controller 101 urges a human operator to select an appropriate property for the connection by means of an input device 103. The property is forwarded to an electromagnetic field simulator 106, which calculates line constants of the connection. Through calculations, the electromagnetic field simulator 106 creates a line model. A substitution block 105 receives the component symbols so as to extract a corresponding device model from a component library 105a. A combination block 107 combines the line model and device model together to form an equivalent circuit, which is a subject being evaluated. Thus, a circuit simulator 108 performs transmission-line analysis on the equivalent circuit with respect to its transmission-line delay characteristic and transmission-line reflection characteristic.

FIG. 24 shows an example of a circuit model in which a driver IC 201 and a receiver IC 202 are mounted (or fabricated) on a printed-circuit board 200. The aforementioned simulator is capable of evaluating electric characteristics of signals, which are transmitted from the driver IC 201 to the receiver IC 202 by way of a line 203.

That is, it is possible to produce an analysis model and its analysis result with respect to the circuit model formed on the board 200 shown in FIG. 24. Namely, FIG. 25A shows an example of the analysis model, and FIG. 25B shows an example of the analysis result.

The analysis model of FIG. 25A simply shows the circuit model in which the driver IC 201 and the receiver IC 202 are connected together by way of the line 203. Herein, an equivalent circuit being formed using a voltage source (or current source) and a certain value of impedance is substituted for the driver IC 201, while an equivalent circuit being formed using a certain value of impedance is substituted for the receiver IC 202. In addition, the line 203 is replaced with a simple equipotential line or a transmission line which is constructed by combining resistors, inductors and capacitors, for example.

The analysis results of FIG. 25B show a voltage waveshape, which is being measured at an input of the receiver IC 202. This voltage waveshape includes relatively large "overshoot" in a rise portion, and it also includes "undershoot" in a decay portion. Such voltage waveshape cannot guarantee a normal operation of a subject circuit which is a subject being evaluated. Hence, it can be said that a printed-circuit board having such a subject circuit is inappropriate for manufacturing.

To improve electric characteristics, it is possible to propose another analysis model shown in FIG. 26A, in which a filter circuit 204 is inserted between the driver IC 201 and the line 203. By insertion of such a filter circuit 204, it is possible to suppress the overshoot and undershoot in the voltage waveshape, which is shown in FIG. 26B.

Using the aforementioned operations of the transmission-line simulator, it is possible to change circuit parameters with ease. Thus, it is possible to optimize circuit design with ease. In addition, it is possible for engineers to grasp a signal waveshape of the circuit before actual manufacture of the printed-circuit board having the circuit. This reduces reprints of printed-circuit boards due to errors in circuit design. So, it is possible to reduce an amount of cost in manufacture of the printed-circuit boards.

In some cases, the printed-circuit boards are designed to have power supply circuits, which supply active components such as ICs and LSI devices with stable direct-current voltages, other than the aforementioned circuits that perform transmission and reception of signals. FIG. 27 shows an example of an equivalent circuit which is created in connection with the power supply circuit. That is, the equivalent circuit of FIG. 27 contains a power supply circuit 210, which corresponds to an area encompassed by a dotted line.

Specifically, the equivalent circuit of FIG. 27 contains an IC 205 being connected with a power terminal 206 and a ground terminal 207, between which a capacitor 208 and a DC power source 209 are connected. Herein, the capacitor 208 acts as the power supply circuit 210, while the DC power source 209 is provided outside of the board. In addition, the capacitor 208 is connected in proximity to the IC 205. This provides replacement of the DC power source 209. That is, the capacitor 208 supplies the IC 205 with electric charges, which are required for the IC 205 to perform switching operations. Incidentally, it is possible to use a low-impedance capacitor as the capacitor 208. In that case, no variations are caused to occur in voltage between the power terminal 206 and ground terminal 207 even when the IC 205 performs the switching operations.

The aforementioned capacitor 208 is called a decoupling capacitor. Until recently, it is believed that the conventional circuit simulators do not have to analyze high frequency characteristics of the power source circuits, which are assumed as DC circuits by being coupled with the decoupling capacitors.

Recently, however, active components such as ICs and LSI devices are rapidly developed in operating frequencies to become higher and higher. This indicates necessity of evaluation being performed on the power supply circuits with respect to their high frequency characteristics. Until now, however, no engineers actually propose techniques for evaluation of the high frequency characteristics of the power supply circuit by numerical analysis. As a result, the engineers related to technologies of printed-circuit boards suffer from problems, as follows:

(1) It is impossible to sufficiently guarantee quality in circuit operations of the printed-circuit boards.
(2) The printed-circuit boards radiate unwanted electromagnetic waves.

Now, a description will be given in detail with respect to the problem (1). With respect to the decoupling capacitor, there are provided two kinds of impedance due to parasitic inductance, i.e., first impedance being caused by parasitic inductance of a decoupling capacitor itself and second impedance being caused by other parasitic inductance due to pads and via hole(s) for installing the decoupling capacitor on the board. When the operating frequency of the active component becomes higher, a sum of the first impedance and second impedance becomes large as compared with impedance corresponding to capacitance of the decoupling capacitor. For this reason, it becomes difficult to supply the active component with stable DC voltage. That is, it is hard to guarantee stable operations of the active component. Such difficulty will be described with reference to FIG. 28.

FIG. 28 is a sectional view showing a simplified construction of a decoupling capacitor, which is installed on a board (or substrate). Specifically, FIG. 28 shows a capacitor 220 being interconnected with an power layer 221 and a ground layer 222, which are formed inside of the substrate, by way of pads 223, 224 and a via hole 225. Herein, parasitic inductance of the capacitor 220 itself is approximately 1 nH if the capacitor is made as a chip component, while parasitic inductance of the pads 223, 224 and via hole 225 is approximately 1 nH in total. As the capacitator 220, it is possible to use a capacitor of a chip type of 0.1 μF, for example. In that case, however, the capacitor whose operating frequency is greater than 36 MHz does not act as a capacitive component any more but acts as an inductive component. For this reason, it is necessary to design the circuits such that the inductance is reduced as small as possible. If the circuits are designed not to reduce the inductance so much, variations of power voltage become large, so it may be impossible to guarantee normal circuit operations.

Next, a description will be given in detail with respect to the problem (2). When the operating frequency of the active component becomes high, lines inside of the power supply circuit do not act as simple equipotential lines but act as transmission lines. As a result, the power supply circuit as a whole acts as a resonance circuit with regard to the transmission lines. Due to resonance, the board installing the active component radiates strong electromagnetic waves. Such resonance will be described with reference to a concrete example of circuitry shown in FIG. 29.

FIG. 29 shows a circuit model that is designed more realistically to match with a board being actually manufactured. That is, the circuit model of FIG. 29 shows a power supply circuit (234) connected with multiple decoupling capacitors. In FIG. 29, an IC 205 is interconnected with a decoupling capacitor 230a and lines 231 that act as transmission lines. In addition, there are provided a decoupling capacitor 230b, which is being connected with another IC (not shown), and a DC power source 209 which is provided outside of the board. Both of the decoupling capacitors 230a, 230b have a similar configuration. That is, the decoupling capacitor (230a) includes capacitance 233 and parasitic inductance 232 in series. An overall area of the power supply circuit 234 is encompassed by a dashed line in FIG. 29. The power supply circuit 234 sometimes causes resonance.

FIG. 30 shows impedance characteristics with respect to frequencies. That is, a solid-line characteristic shows an example of the impedance characteristic based on impedance Zin of the power supply circuit 234 being observed from the IC 205, while a dotted-line characteristic shows an example of the impedance characteristic based on impedance Zc of the decoupling capacitor 230a. Herein, the impedance characteristic of Zin approximately matches with the impedance characteristic of Zc. But, the impedance characteristic of Zin greatly differs from the impedance characteristic of Zc at frequencies f01, f02. Differences between those characteristics are caused because of reasons as follows:

As shown by the dotted-line characteristic, the impedance Zc of the decoupling capacitor 230a functions as inductive reactance. In addition, the impedance of the power supply circuit 234, which is being connected to follow the decoupling capacitor 230a, functions as capacitive reactance. When both of the inductive reactance and capacitive reactance coincide with each other in magnitude, parallel resonance is being caused to occur.

When the resonance is caused to occur, the impedance Zin of the power supply circuit 234 being observed from the IC 205 becomes large. This causes variations of power voltage to become large. If resonance energy is accumulated in the power supply circuit, strong electromagnetic waves are radiated from the power supply circuit. In that case, it becomes hard to pass regulations specified by standards regarding EMI (i.e., electromagnetic interference) or radiation of unwanted electromagnetic waves.

SUMMARY OF THE INVENTION

It is an object of the invention to provide a system and method for evaluation of electric characteristics of printed-circuit boards in which evaluation is made as to whether the printed-circuit boards are designed to suppress variations of power voltages while avoiding radiation of unwanted electromagnetic waves due to resonance of power supply circuits inside of active components installed on the printed-circuit boards.

It is another object of the invention to provide storage media that store programs and data for evaluation of the electric characteristics of the printed-circuit boards.

Specifically, this invention performs evaluation of the printed-circuit boards particularly with respect to high frequency characteristics of the power supply circuits in accordance with numerical analysis.

A printed-circuit board characteristic evaluation system of this invention is basically configured by an input device, a data processing device, a storage device and an output device. Herein, the input device inputs layout information representing an overall layout of a printed-circuit board installing at least one active component, from which the data processing device extracts layout information data regarding a power supply circuit. The layout information data is stored in the storage device and is converted to electric circuit information representing an equivalent circuit model with respect to a selected side of the printed-circuit board. Then, calculations are performed based on the layout information data to produce impedance characteristics with respect to the power supply circuit. A decision is made as to whether resonance is caused to occur in the power supply circuit or not on the basis of results of comparison of the impedance characteristics. The output device outputs the impedance characteristics as well as resonance information, which is provided to represent occurrence of resonance and its resonance frequency.

Incidentally, it is possible to calculate first, second, third and fourth impedance characteristics based on the electric circuit information with respect to the power supply circuit. Herein, the first impedance characteristic is calculated based on impedance of the power supply circuit being observed from a prescribed power terminal connecting position. The second impedance characteristic is calculated based on impedance of a selected circuit portion which lies from the prescribed power terminal connecting position to a capacitor arranged in most proximity to the prescribed power terminal connecting position on the printed-circuit board. The third impedance characteristic is calculated based on impedance of a capacitor which is connected in most proximity to a power terminal connecting position of the active component installed on the printed-circuit board. The fourth impedance characteristic is calculated based on impedance of the power supply circuit being connected to follow the capacitor on the printed-circuit board. In addition, the comparison is made on the aforementioned impedance characteristics with respect to at least one of prescribed factors such as magnitude, phase, real-number part and imaginary-number part.

Next, if it is determined that resonance is caused to occur in the power supply circuit, the system changes the layout information, from which new layout information data is being extracted. In addition, the system locates a point of the power supply circuit at which values of electric current and voltage become large in response to a sine wave signal of the resonance frequency being input to the power supply circuit from the prescribed power terminal connecting position. Further, a resonance suppression technique (e.g., installation of a decoupling capacitor) is applied to the located point of the power supply circuit or the prescribed power terminal connecting position. Then, the system performs evaluation as to whether resonance is still caused to occur in the power supply circuit, regardless of the resonance suppression technique.

Thus, the system is capable of performing evaluation as to whether printed-circuit boards are well designed to suppress variations of power voltages while inhibiting radiation of unwanted electromagnetic waves from occuring due to resonance of power supply circuits.

BRIEF DESCRIPTION OF THE DRAWINGS

These and other objects, aspects and embodiments of the present invention will be described in more detail with reference to the following drawing figures, of which:

FIG. 17 is a flowchart showing additional operations of the printed-circuit board characteristic evaluation system in accordance with a second modified example of the embodiment 2;

DESCRIPTION OF THE PREFERRED EMBODIMENTS

This invention will be described in further detail by way of examples with reference to the accompanying drawings.

[A] EMBODIMENT 1

Figure 1:
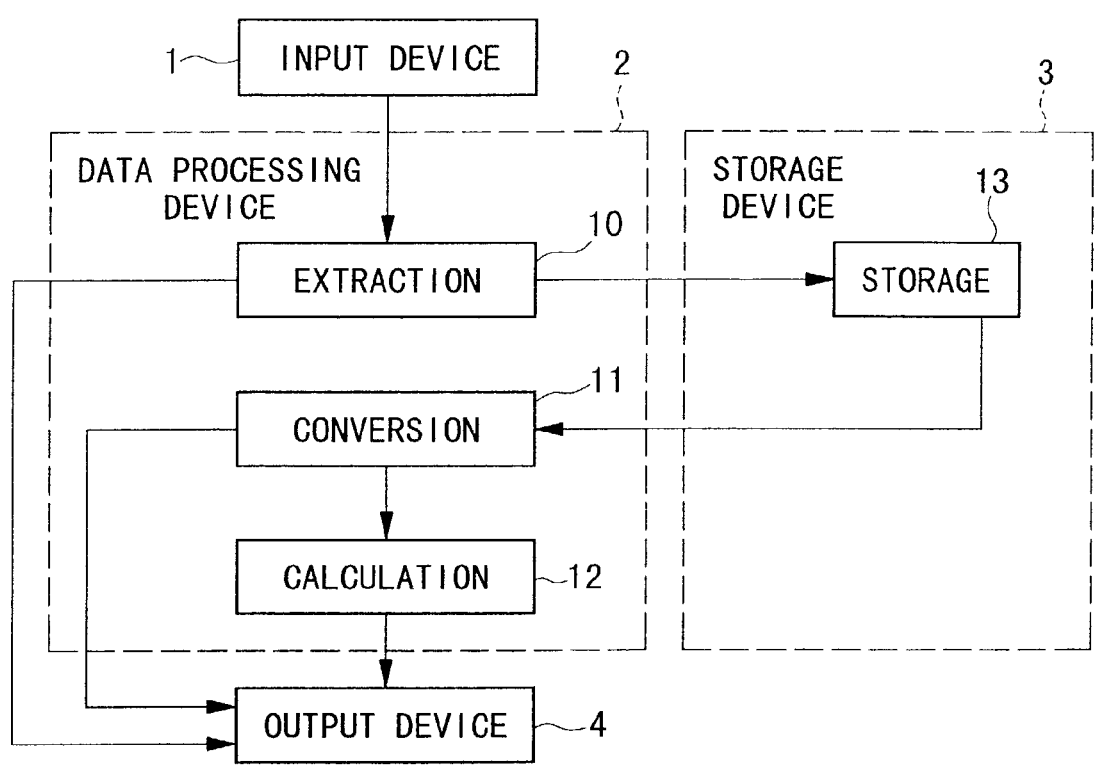
FIG. 1 is a block diagram showing a configuration of a printed-circuit board characteristic evaluation system in accordance with embodiment 1 of the invention.

FIG. 1 is a block diagram showing a configuration of a printed-circuit board characteristic evaluation system in accordance with embodiment 1 of the invention.

The printed-circuit board characteristic evaluation system of FIG. 1 is mainly configured by an input device 1, a data processing device 2, a storage device 3 and an output device 4. Herein, the data processing device 2 contains an extraction block 10, a conversion block 11 and a calculation block 12. In addition, the storage device 3 contains a storage block 13.

Figure 2:
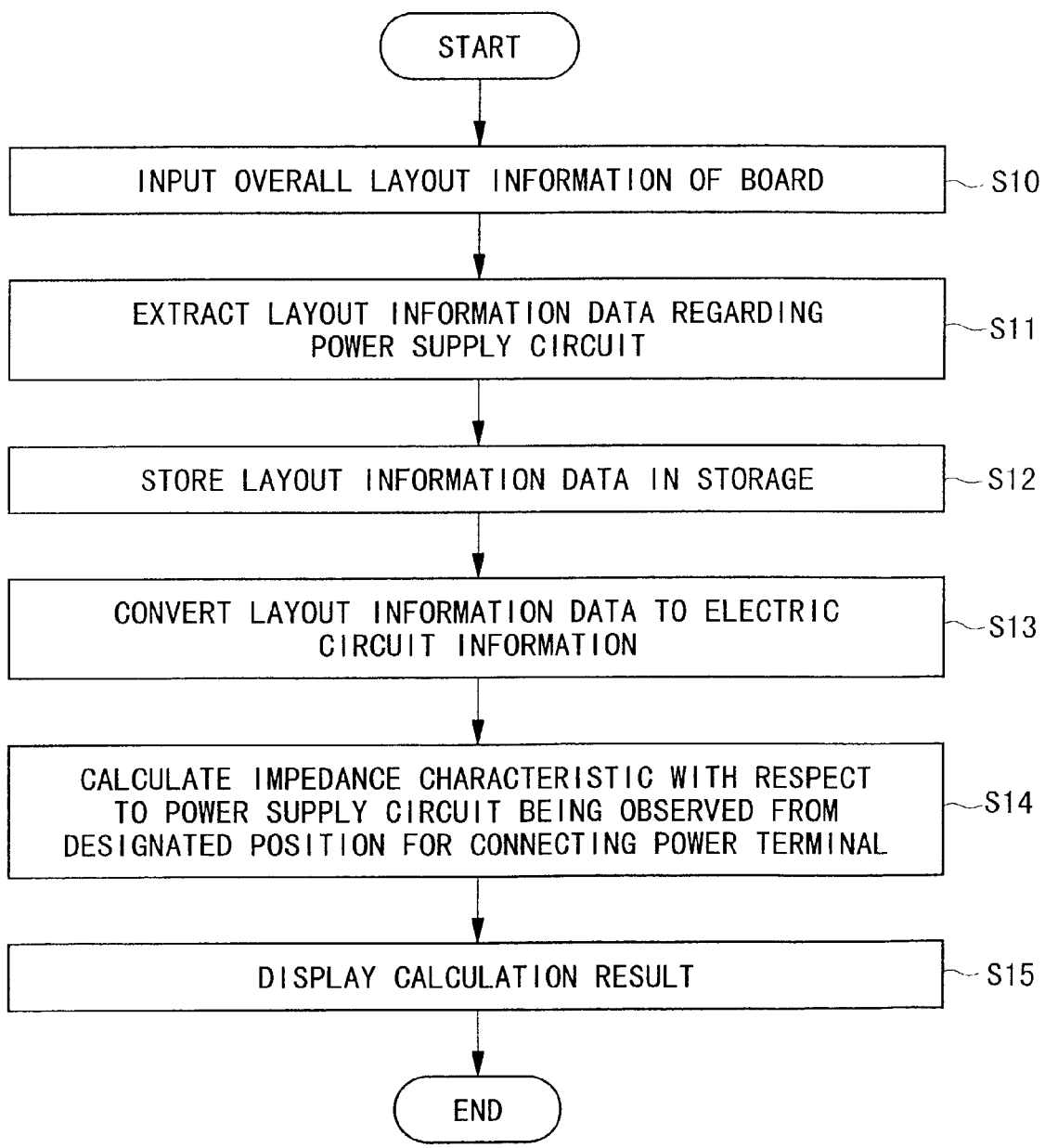
FIG. 2 is a flowchart showing operations of the printed-circuit board characteristic evaluation system of FIG. 1.
Figure 3:
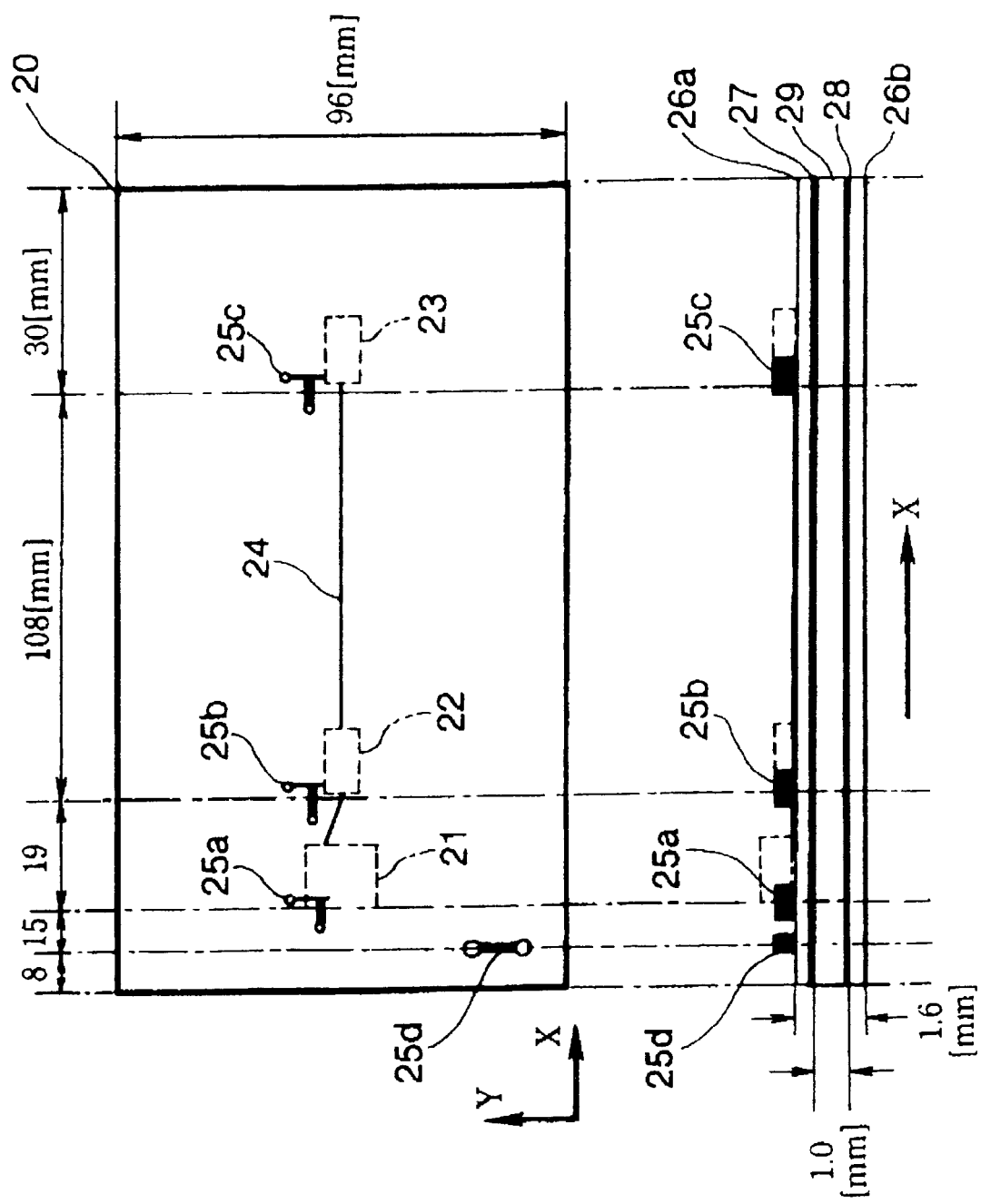
FIG. 3A is a plan view showing a construction of a four-layer printed-circuit board, which is a subject being evaluated.
FIG. 3B is a sectional view of the four-layer printed-circuit board.

Next, operations of the printed-circuit board characteristic evaluation system will be described in detail with reference to FIG. 2 and FIGS. 3A, 3B. Herein, FIG. 2 is a flowchart showing overall operations of the present system, while FIGS. 3A, 3B show an example of a configuration of a four-layer printed-circuit board "20", which is a subject being evaluated. Specifically, FIG. 3A is a plan view of the board, and FIG. 3B is a sectional view of the board.

The printed-circuit board 20 is mainly configured by four layers, i.e., a signal layer 26a, a ground layer 27, a power source layer 28 and a signal layer 26b, which are formed and arranged vertically. Herein, three active components are installed in the signal layer (or first layer) 26a. Namely, an oscillator 21, a driver IC 22 and a receiver IC are arranged in connection with four signal lines 24. In addition, the signal layer 26a installs four decoupling capacitors 25a, 25b, 25c and 25d, which are respectively connected with power terminals of the three active components and a terminal by which electric power is being supplied from the external (not shown). Both of the ground layer (or second layer) 27 and the power source layer (or third layer) 28 construct conductor planes, which cover an overall area of the board. Further, no components nor lines are formed in the signal layer (or fourth layer) 26b. Incidentally, all conductors are made of copper. For example, a board material 29 is made of glass epoxy resin, in which a dielectric constant is 4.7, and a dielectric dissipation factor is 0.015.

Next, operations of the system will be described in detail with reference to FIG. 2. First, the printed-circuit board characteristic evaluation system inputs layout information by means of the input device 1 in step S10. Herein, the layout information corresponds to data regarding layouts of the layers of the printed-circuit board including the installed components described above. Within the layout information, the system extracts only specific layout information data regarding the power supply circuit by means of the extraction block 10 in step S11. The layout information data being extracted are made in connection with pads interconnected with power terminals and ground terminals of the active components installed in the signal layer 26a, lines and via holes for interconnecting the pads with the power source layer 28 or the ground layer 27, and the decoupling capacitors 25a, 25b, 25c, 25d as well as layout information data regarding the ground layer 27 and the power source layer 28. Herein, a simple method for extraction is to attach discriminating symbols such as "V" and "G" to the layout information data of the power supply circuit being extracted.

In step S12, the system stores the extracted layout information data to the storage block 13. In step S13, the conversion block 11 loads the layout information data to convert it to electric circuit information.

Next, details of the step S13 will be described in a concrete manner using an equivalent circuit model of the power supply circuit shown in FIG. 4.

Figure 4:
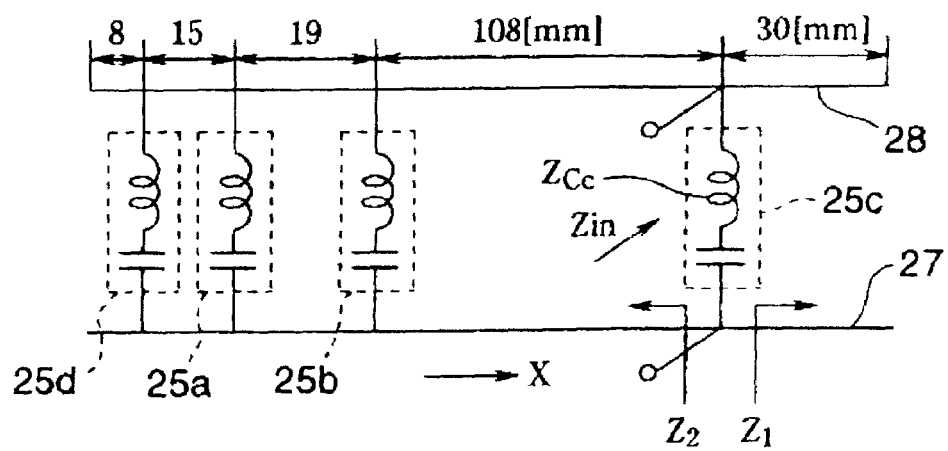
FIG. 4 is a circuit diagram showing an equivalent circuit mode of a power supply circuit.

The equivalent circuit model of FIG. 4 is made by assumption in which the power source layer 28 and the ground layer 27 are equivalent to two parallel-plate lines formed by conductor planes. Herein, the parallel-plate lines are elongated in an X-direction of the board (see FIGS. 3A, 3B). With respect to such an elongated-side direction (or long-side direction), the parallel-plate lines are split into plural sections being perpendicular to the direction at specific positions connecting the decoupling capacitors 25a, 25b, 25c and 25d, which are shown by dotted lines in FIG. 4. Characteristic of the split section is represented using F matrix being mathematically expressed by an equation (1). In addition, characteristics regarding other elements such as the decoupling capacitors and pads are represented using F matrixes being mathematically expressed by equations (2), (3).

$$[F_{Line}(f, l)] = \begin{pmatrix} \cosh\{\gamma(f) \cdot l\} & Z_0 \cdot \sinh\{\gamma(f) \cdot l\} \\ \frac{1}{Z_0} \cdot \sinh\{\gamma(f) \cdot l\} & \cosh\{\gamma(f) \cdot l\} \end{pmatrix} \quad (1)$$

$$[F_{Para}(f, Z)] = \begin{pmatrix} 1 & 0 \\ 1/Z & 1 \end{pmatrix} \quad (2)$$

$$[F_{Seri}(f, Z)] = \begin{pmatrix} 1 & Z \\ 0 & 1 \end{pmatrix} \quad (3)$$

Namely, the equation (1) indicates F matrix representing a transmission-line characteristic, wherein $Z_0$ is characteristic impedance of the line, which is determined by a physical shape of the line and electric constants (e.g., dielectric constant and relative magnetic permeability) of a support body forming the line. The aforementioned F matrix can be produced using equations, which are described on pp. 1611–1612 of Proceedings of the IEEE (i.e., Institute of Electrical and Electronics Engineers), Vol. 65, No. 11 published on November of 1977, for example. In addition, γ(f) is a propagation constant of the line. The propagation constant consists of a real-number part indicating an attenuation constant α and an imaginary-number part indicating a phase constant β. Like the aforementioned characteristic impedance, both of the attenuation constant α and phase constant β are determined by the physical shape of the line and the electric constants of the support body forming the line. Concretely speaking, the attenuation constant a can be produced using equations, which are described on pp. 342–350 of IEEE Transaction on Microwave Theory and Techniques, Vol. MTT-16, No. 6 published on June of 1968, for example. In addition, the phase constant β is being determined by a following mathematical expression.

$$\frac{2\pi\sqrt{\varepsilon_r}}{\lambda\sqrt{\mu_r}}$$

In the above, "$\varepsilon_r$" and "$\mu_r$" are dielectric constant and relative magnetic permeability of the support body, and "λ" is a wavelength. In addition, "l" is a line length.

In addition, the aforementioned equation (2) shows F matrix representing a characteristic of impedance Z which is connected in parallel to the line(s), while the equation (3) shows F matrix representing a characteristic of impedance Z which is connected in series with the line(s). To represent a characteristic of a decoupling capacitor, the equation (2) is modified to incorporate "Z", which is mathematically expressed by an equation (4) as follows:

$$Z(f) = R + j\cdot\omega\cdot L + \frac{1}{j\cdot\omega\cdot C} \tag{4}$$

In the above, R is parasitic resistance, L is parasitic inductance, and C is capacitance. Incidentally, parasitic inductance and parasitic resistance of the pad and via hole being connected in series to the decoupling capacitor (i.e., 25a–25d) are contained in an equivalent circuit of the decoupling capacitor. As similar to the aforementioned equivalent circuit model being produced with respect to the long-side direction (i.e., X-direction) of the board, the system also creates an equivalent circuit model with respect to another direction (i.e., short-side direction or Y-direction) perpendicular to the X-direction. For convenience' sake, description regarding creation of such an equivalent circuit model in the Y-direction will be omitted. Thus, the system completes the step S13.

In step S14, the system performs calculations using the electric circuit information by means of the calculation block 12. Thus, the system produces an impedance characteristic with respect to the power supply circuit being observed from a specific location for connecting a designated power terminal. For example, the system produces an impedance characteristic $Z_{in}$ with respect to the power supply circuit being observed from a location for connecting the power terminal of the receiver IC 23. In FIG. 4, the impedance $Z_{in}$ consists of three kinds of impedance being established with regard to the decoupling capacitor 25c, namely $ZC_c$, $Z_1$ and $Z_2$ which are connected in parallel. Herein, $ZC_c$ indicates impedance of the decoupling capacitor 25c itself, $Z_1$ indicates impedance regarding a right side of the capacitor 25c, and $Z_2$ indicates impedance regarding a left side of the capacitor 25c. It is possible to produce the three kinds of impedance $ZC_c$, $Z_1$ and $Z_2$ respectively by using equations (5) to (9), as follows:

$$ZC_c(f) = R_c + j\cdot\omega\cdot L_c + \frac{1}{j\cdot\omega\cdot C_c} \tag{5}$$

$$\begin{pmatrix} A & B \\ C & D \end{pmatrix} = [F_{Line}(f, l_a)] \tag{6}$$

$$Z_1(f) = \frac{A}{C} \tag{7}$$

$$\begin{pmatrix} E & F \\ G & H \end{pmatrix} = [F_{Line}(f, l_b)]\cdot[F_{Para}(f, Z_{c1})]\cdot \tag{8}$$
$$[F_{Line}(f, l_c)]\cdot[F_{Para}(f, Z_{c2})]\cdot$$
$$[F_{Line}(f, l_d)]\cdot[F_{Para}(f, Z_{c3})]\cdot[F_{Line}(f, l_e)]$$

$$Z_2(f) = \frac{E}{G} \tag{9}$$

Namely, the impedance $ZC_c$ is produced using the equation (5), while the impedance $Z_1$ is produced using the equation (7) based on the F matrix element of the equation (6). Similarly, the impedance $Z_2$ is produced using the equation (9) based on the F matrix element of the equation (8). An advantage in using the F matrixes for calculation processing is to bring an easy way for calculations in which each impedance can be produced using products of the F matrixes, as shown in the equation, with respect to each of the transmission lines and parts which are connected together in series. Lastly, the impedance $Z_{in}$ is given by a following equation (10).

$$Z_{in}(f) = \frac{Z_1(f)\cdot Z_2(f)\cdot ZC_c}{Z_1(f)\cdot Z_2(f) + Z_1(f)\cdot ZC_c(f) + Z_2(f)\cdot ZC_c(f)} \tag{10}$$

Figure 5:
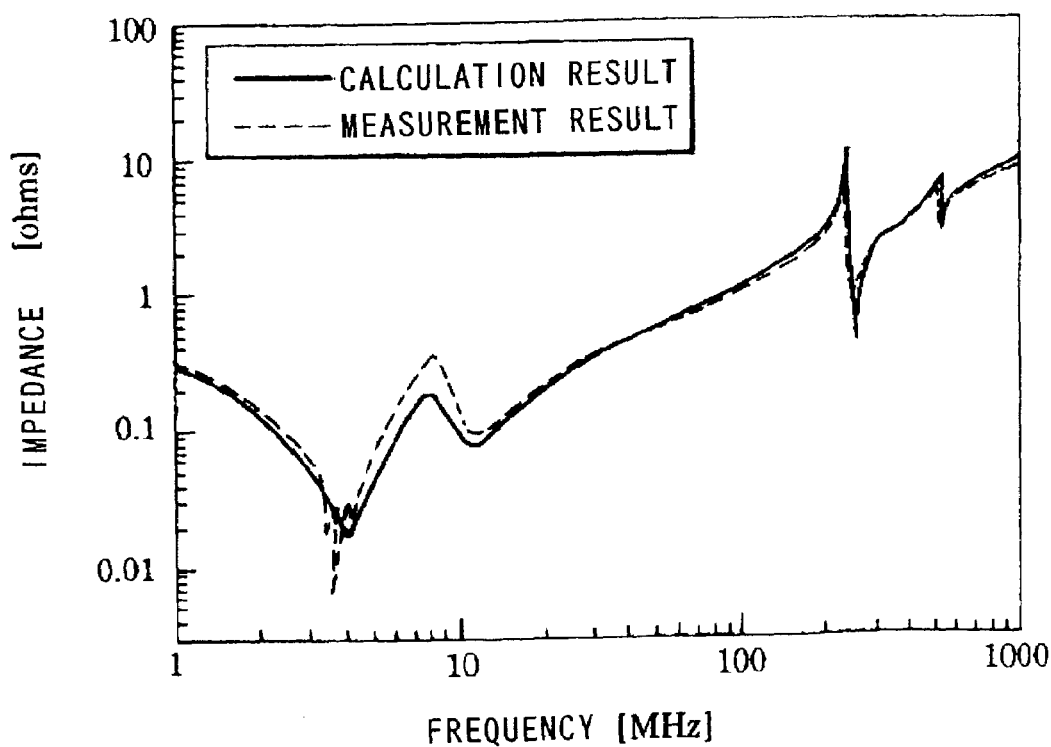
FIG. 5 is a graph showing calculation result and measurement result with respect to impedance characteristics of the power supply circuit.

In step S15, the present system outputs (or displays) calculation results. An example of the calculation results is shown in FIG. 5, wherein a "solid" curve shows the calculation result which is made with respect to the long-side direction of the board, while a "dotted" curve shows measurement result. Herein, each curve is represented in impedance with respect to frequency. Incidentally, the measurement result is made through measurement being performed on a board, which is actually manufactured as shown in FIGS. 3A, 3B and which installs parts thereon. Using a network analyzer, the measurement is performed with respect to reflection characteristic at the aforementioned position for connecting the power terminal (or power terminal connecting position, see step S11). Then, the impedance $Z_{in}$ is calculated based on the measurement result in accordance with an equation (11), as follows:

$$Z_{in} = 50 \cdot \frac{1+S_{11}}{1-S_{11}} \qquad (11)$$

Through the calculations, it is possible to observe variations of characteristics of the power supply circuit in response to frequencies. That is, the impedance $Z_{in}$ shows that the power supply circuit acts as an inductive component if its operating frequency is higher than 4 MHz or so. In addition, the impedance of the power supply circuit is approximately 1 Ohm if the operating frequency is 100 MHz. Further, resonance is caused to occur in the power supply circuit at specific operating frequencies, i.e., 8 MHz, 230 MHz and 510 MHz. The graph of FIG. 5 shows that the measurement result well matches with the calculation result. This indicates that the calculations employed by the present system are appropriate. In addition, no resonance is caused to occur with respect to the short-side direction (or Y-direction) of the board. So, all resonance phenomena are caused to occur with respect to only the long-side direction (or X-direction).

According to the present embodiment, it is possible to easily grasp the impedance characteristic of the power supply circuit being observed from the power terminal connecting position of the active component installed on the board. In addition, it is possible to make confirmation as to whether resonance is caused to occur in the power supply circuit or not, and it is possible to easily grasp resonance frequencies. In short, the present embodiment is capable of calculating the impedance characteristic of the power supply circuit by using the layout information of the board. Hence, it is unnecessary to actually manufacture the board. That is, during or after creation of layout prior to manufacture of the board, it is possible to make examination (or evaluation) as to whether the power supply circuit is well designed to have sufficiently low impedance or not, or it is possible to make examination as to whether resonance is caused to occur in the power supply circuit or not.

As a result, the present embodiment is capable of producing layout information with respect to the board, which is designed optimally. Thus, it is possible to design and manufacture printed-circuit boards in short periods of time, wherein the printed-circuit boards are designed to guarantee stable operations and suppress radiation of electromagnetic waves.

[B] EMBODIMENT 2

Figure 6:
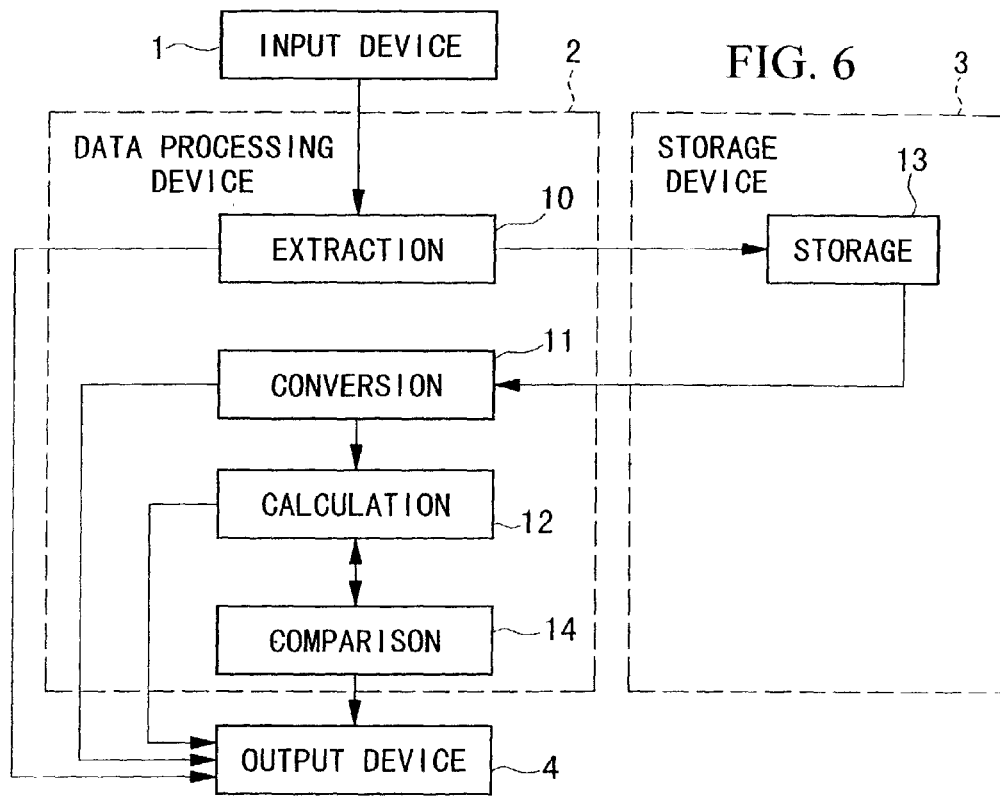
FIG. 6 is a block diagram showing a configuration of a printed-circuit board characteristic evaluation system in accordance with embodiment 2 of the invention.

FIG. 6 is a block diagram showing a configuration of a printed-circuit board characteristic evaluation system in accordance with embodiment 2 of the invention.

As compared with the aforementioned embodiment 1 shown in FIG. 1, the embodiment 2 of FIG. 6 is characterized by additionally incorporating a comparison block 14 in the data processing device 2. This comparison block 14 brings a capability in making a decision as to whether resonance is caused to occur in the power supply circuit or not.

Figure 7:
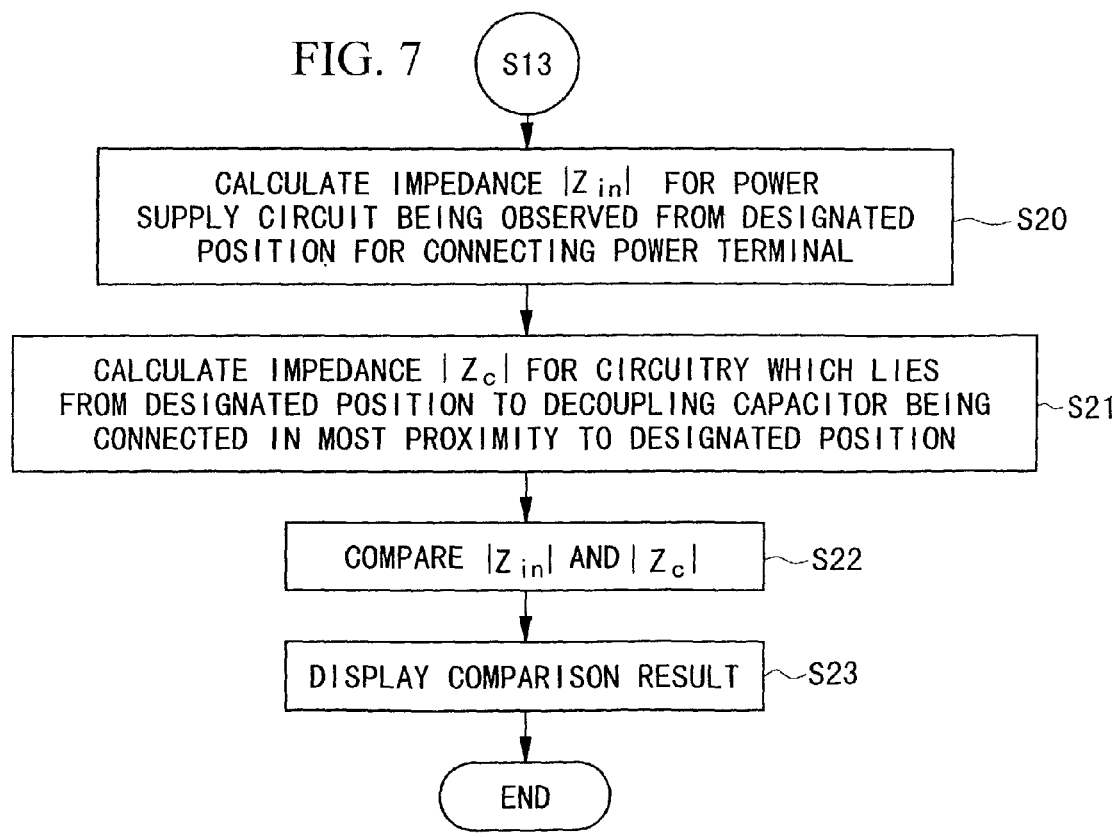
FIG. 7 is a flowchart showing operations of the printed-circuit board characteristic evaluation system of FIG. 6.

Next, operations of the present embodiment will be described with reference to a flowchart of FIG. 7.

The present embodiment uses the aforementioned steps S10 to S13 shown in FIG. 2. Hence, those steps are omitted in FIG. 7. That is, the present embodiment is characterized by performing steps S20 to S23 after the aforementioned steps S10 to S13.

In the aforementioned step S13, the present system produces the electric circuit information with respect to the power supply circuit. Then, the system proceeds to step S20 (see FIG. 7), wherein it produces magnitude (or absolute value) of impedance $|Z_{in}|$ of the power supply circuit being observed from a designated power terminal connecting position. In step S21, the system calculates magnitude of impedance $|Z_c|$, which lies from the designated power terminal connecting position to a decoupling capacitor being connected in most proximity to the designated power terminal connecting position. In step S22, the system compares them together. In step S23, the system outputs (or displays) comparison result.

Figures 8, 9:
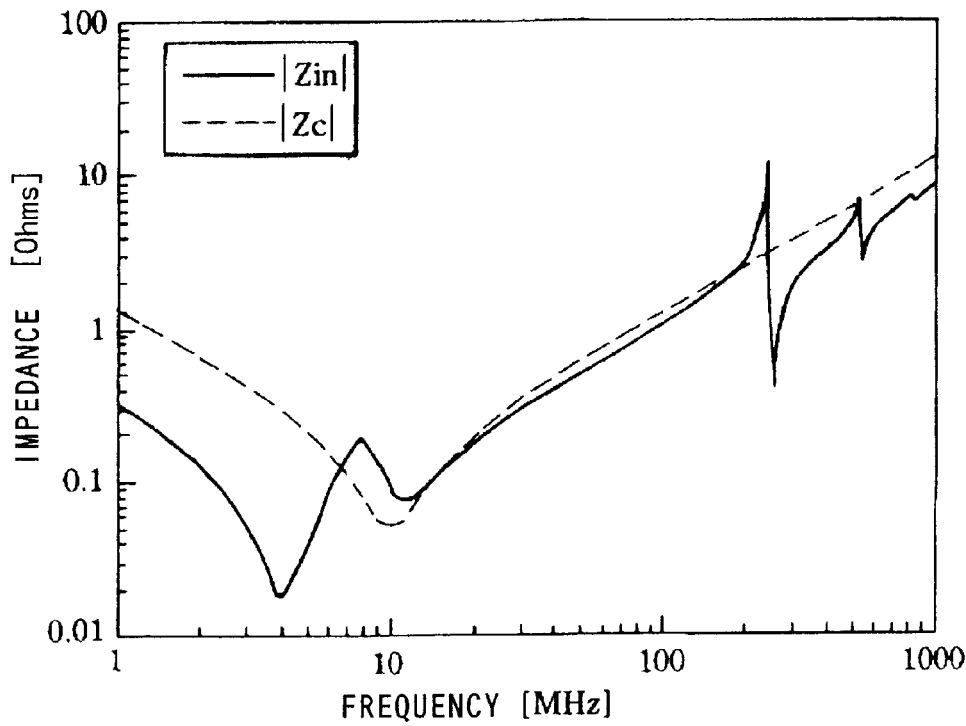
FIG. 8 is a graph showing impedance characteristics in connection with the power supply circuit.
FIG. 9 is a block diagram showing other operations of the printed-circuit board characteristic evaluation system of FIG. 6.

FIG. 8 shows an example of calculation results of $|Z_{in}|$ and $|Z_c|$, characteristic curves of which are drawn together. At resonance frequencies of 8 MHz, 230 MHz and 510 MHz, $|Z_{in}|$ is greater than $|Z_c|$. So, by comparison in magnitude between them, it is possible to make a decision as to whether resonance is caused to occur in the power supply circuit or not. Incidentally, FIG. 8 shows that $|Z_{in}|$ and $|Z_c|$ substantially coincide with each other in certain frequency ranges whose frequencies are higher than 10 MHz, except the resonance frequencies. This is because the decoupling capacitor which is connected in most proximity to the power terminal is lower in impedance than elements of the power supply circuit, so that $|Z_{in}|$ is being directly determined by the impedance $|Z_c|$ of the decoupling capacitor.

Next, a description will be given with respect to another method for making examination as to whether resonance is caused to occur in the power supply circuit by the present embodiment with reference to a flowchart of FIG. 9.

The flowchart of FIG. 9 consists of four steps (i.e., S25–S28) to follow the aforementioned step S13. After the step S13, the present system proceeds to step S25, wherein it calculates magnitude of impedance $|Z_c'|$ of the decoupling capacitor which is connected in most proximity to the power terminal connecting position of the active component installed on the printed-circuit board. In step S26, the present system calculates magnitude of impedance $|Z_{in2}|$ with respect to the power supply circuit being connected to follow the decoupling capacitor. In step S27, the system compares them together to make a decision as to whether resonance is caused to occur in the power supply circuit or not. In step S28, the system outputs (or displays) calculation results of the impedance, decision result of the resonance and its resonance frequencies.

Figure 10:
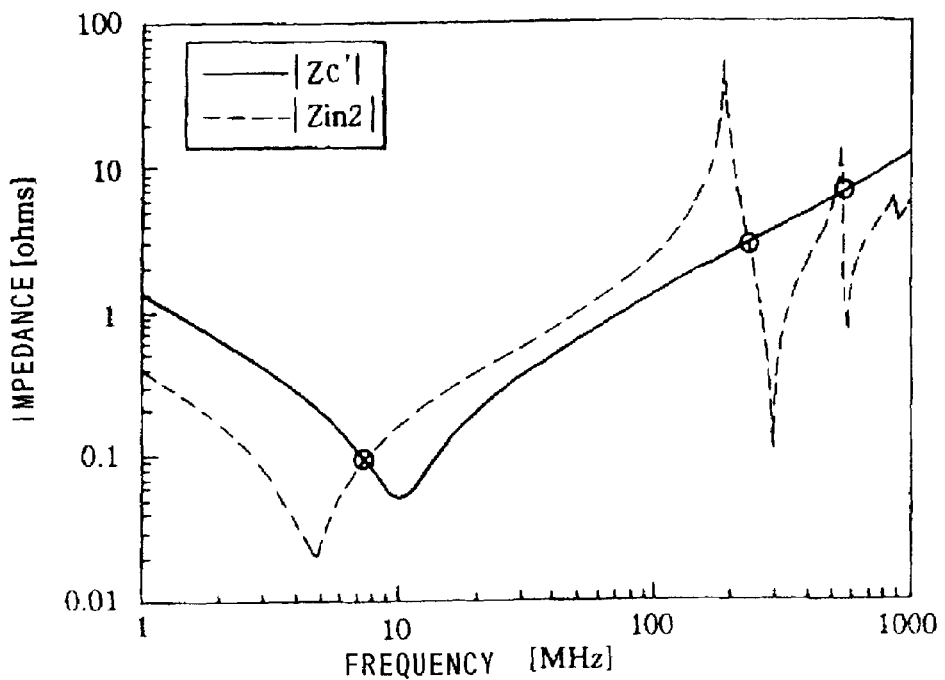
FIG. 10 is a graph showing other impedance characteristics in connection with the power supply circuit.

FIG. 10 shows an example of the calculation results, wherein a characteristic curve of the impedance $|Z_c'|$, which acts as capacitive reactance (i.e., capacitive component), intersects a characteristic curve of the impedance $|Z_{in2}|$, which acts as inductive reactance (i.e., inductive component), at a frequency of 8 MHz. Similarly, the characteristic curve of the impedance $|Z_c'|$, which acts as inductive reactance, intersects the characteristic curve of the impedance $|Z_{in2}|$, which acts as capacitive reactance, at frequencies of 230 MHz and 510 MHz.

As described above, when the capacitive reactance coincides with the inductive reactance, parallel resonance is caused to occur in the power supply circuit. Therefore, it is possible to make examination as to whether resonance is caused to occur or not by detecting a point (or points) of intersection between the aforementioned characteristic curves. In addition, it is possible to read resonance frequencies from the points of intersection.

Next, a description will be given with respect to a further method for making examination as to whether resonance is caused to occur or not with reference to a flowchart of FIG.

11, which consists of four steps (i.e., S30–S33) to follow the aforementioned step S13. That is, after the step S13, the present system proceeds to step S30, wherein it calculates reactance Im($Z_c'$) within impedance of the decoupling capacitor, which is connected in most proximity to the power terminal connecting position of the active component installed on the printed-circuit board. In step S31, the system calculates reactance Im($Z_{in2}$) within impedance of circuit elements being connected to follow the decoupling capacitor. In step S32, the system compares them together. In step S33, the system outputs (or displays) calculation results of the impedance, decision result of the resonance and its resonance frequencies.

Figure 12:
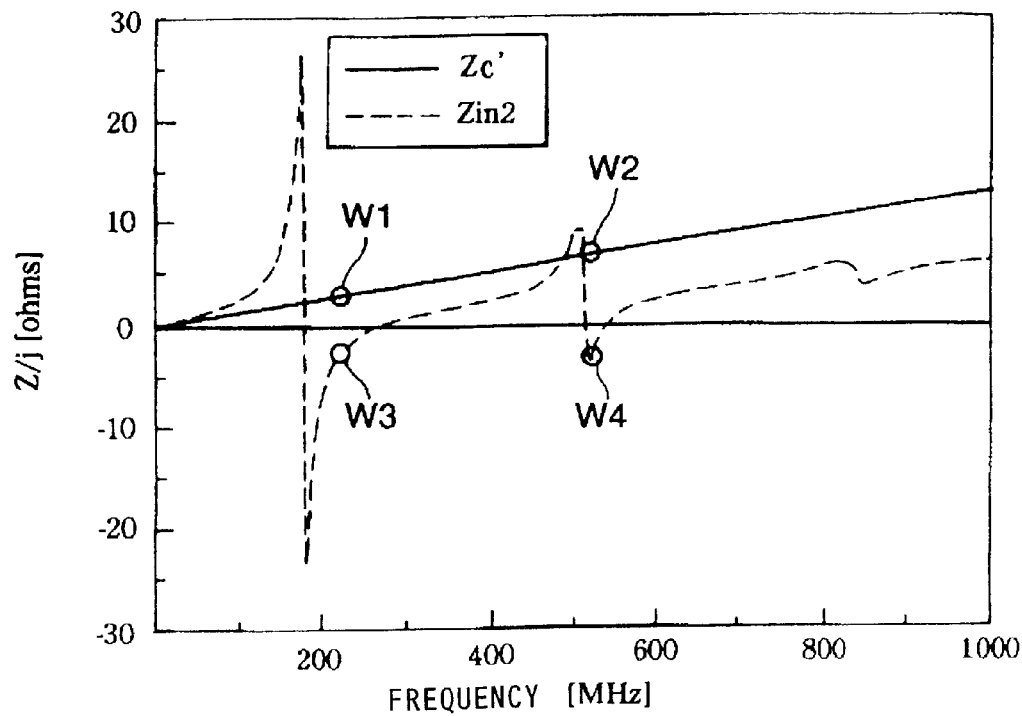
FIG. 12 is a graph showing further impedance characteristics in connection with the power supply circuit.

FIG. 12 shows an example of the calculation results, wherein a vertical axis represents "reactance", and a horizontal axis represent "frequency". Herein, points W1, W2 are plotted on a "solid" characteristic curve of the reactance Im($Z_c'$), while points W3, W4 are plotted on a "dotted" characteristic curve of the reactance Im($Z_{in2}$). The points W1, W3 are reverse to each other in sign but substantially coincide with each other in magnitude of the reactance at a frequency of 230 MHz. Similarly, the points W2, W4 are reverse to each other in sign but substantially coincide with each other in magnitude of reactance at a frequency of 510 MHz. From those points, it is possible to detect that resonance is caused to occur in the power supply circuit at each of the frequencies of 230 MHz and 510 MHz. That is, it is possible to make a decision as to whether the resonance is caused to occur or not by detecting the frequency at which the reactance Im($Z_c'$) and the reactance Im($Z_{in2}$) are reverse from each other in sign but substantially coincide with each other in magnitude.

Figure 13:
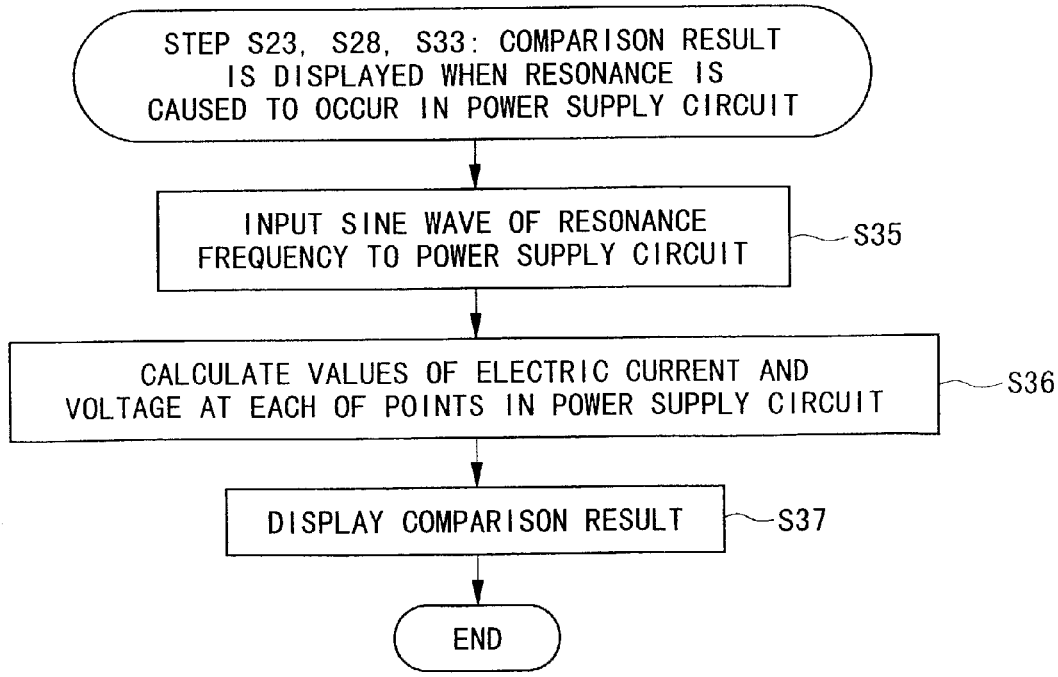
FIG. 13 is a flowchart showing additional operations of the printed-circuit board characteristic evaluation system in accordance with a first modified example of the embodiment 2 shown in FIG. 6.

Next, a description will be given with respect to a first modified example of the present embodiment, which is designed by adding a first calculation function to the aforementioned calculation block 12 shown in FIG. 6 with reference to FIG. 13.

Figure 11:
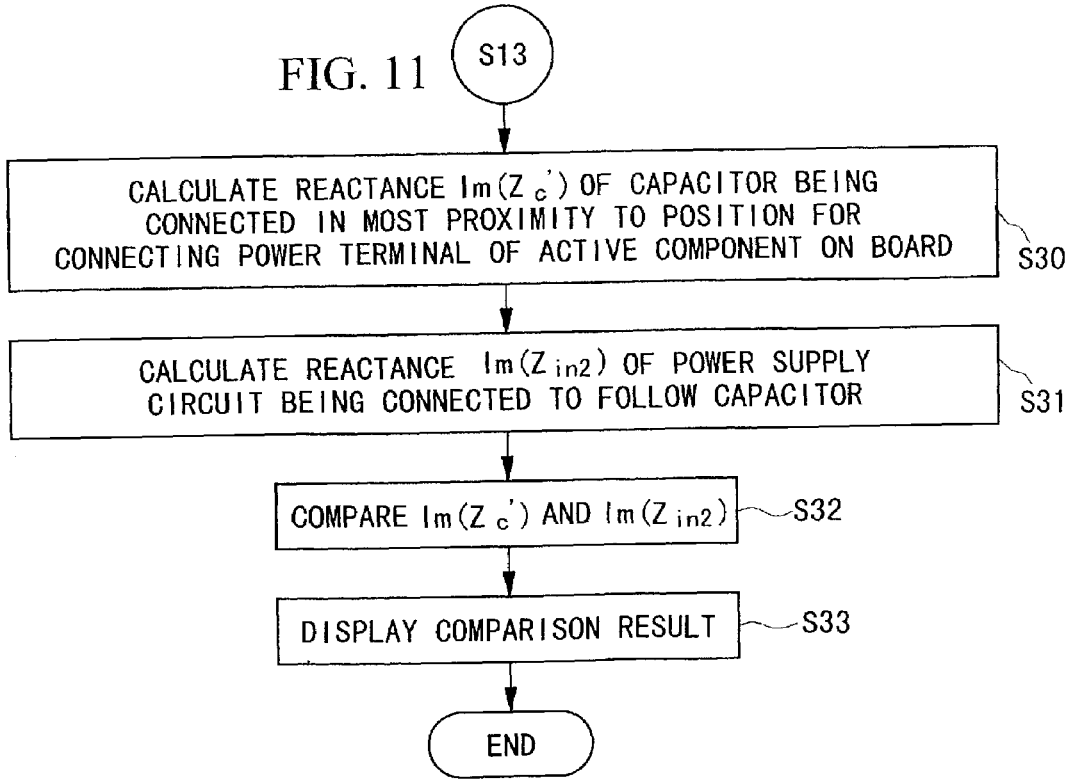
FIG. 11 is a flowchart showing further operations of the printed-circuit board characteristic evaluation system of FIG. 6.
Figure 14:
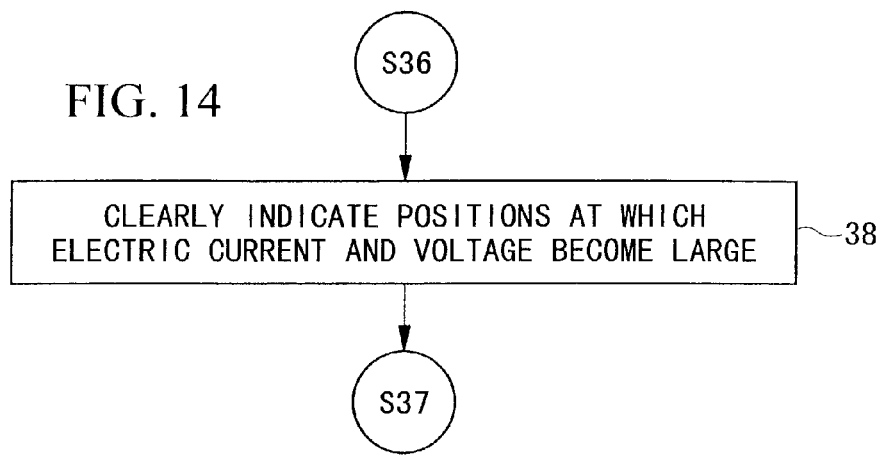
FIG. 14 is a simplified flowchart showing a further additional operation of the printed-circuit board characteristic evaluation system in accordance with the first modified example of the embodiment 2.

Overall operations of the first modified example are basically similar to the foregoing steps being executed by the present embodiment. So, the first calculation function will be described using a flowchart of FIG. 13, which follows the foregoing step S23, S28 or S33 shown in FIG. 7, 9 or 11. Actually, after the above step in which the comparison result is displayed when the present system determines that resonance is caused to occur in the power supply circuit at a certain resonance frequency, the present system proceeds to step S35, wherein a sine wave of the resonance frequency is input to a designated power terminal connecting position with respect to the power supply circuit. In step S36, the present system calculates values of electric current and voltage at each of points in the power supply circuit. In step S37, the system outputs (or displays) calculation results. It is possible to insert an additional step S38 shown in FIG. 14 between the steps S36 and S37. In the step S38, the system clearly indicates a point (or points) at which the values of the electric current and voltage are relatively large. As a signal source model for producing a signal of the resonance frequency, it is possible to use a series circuit in which a voltage source for outputting a sine wave signal and an impedance component are connected together in series or a parallel circuit in which a current source for outputting a sine wave signal and an impedance component are connected together in parallel, for example.

Figure 15A:
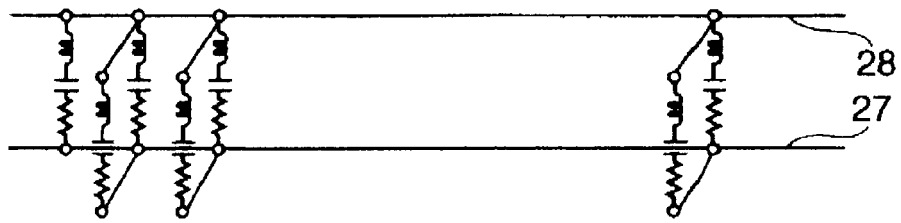
FIG. 15A is a circuit diagram simply showing an equivalent circuit of the printed-circuit board characteristic evaluation system of the embodiment 2.
Figure 15B:
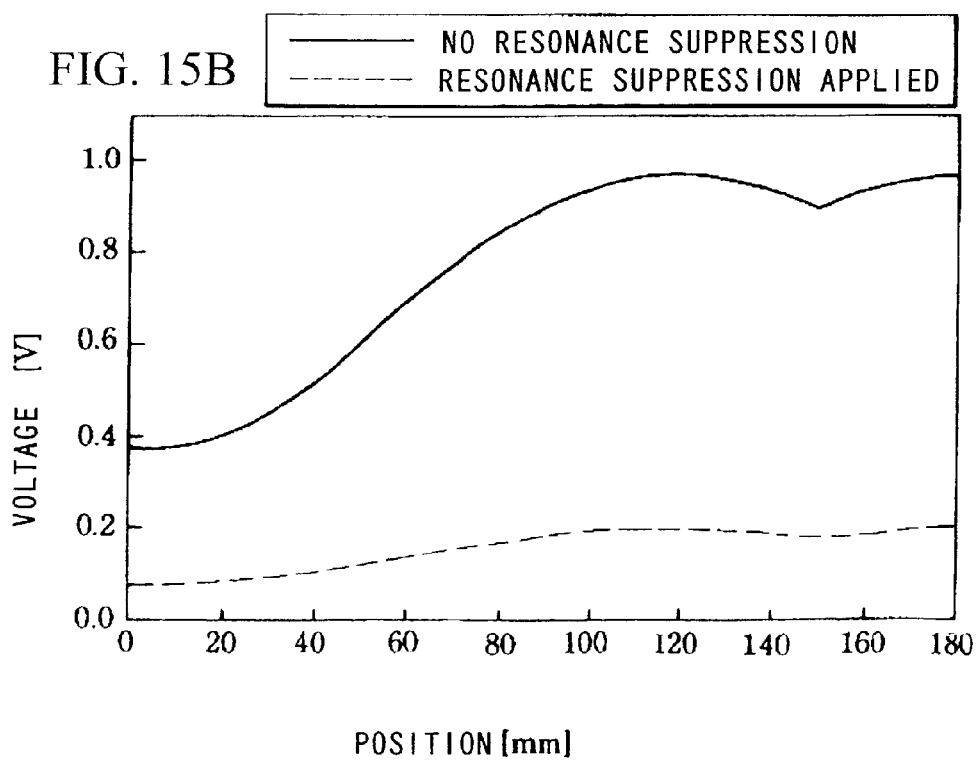
FIG. 15B is a graph showing distributions of electric voltages in a power supply circuit of the system of the embodiment 2 under a prescribed condition in which a sine wave signal is input to a power terminal connecting position of an receiver IC.
Figure 16A:
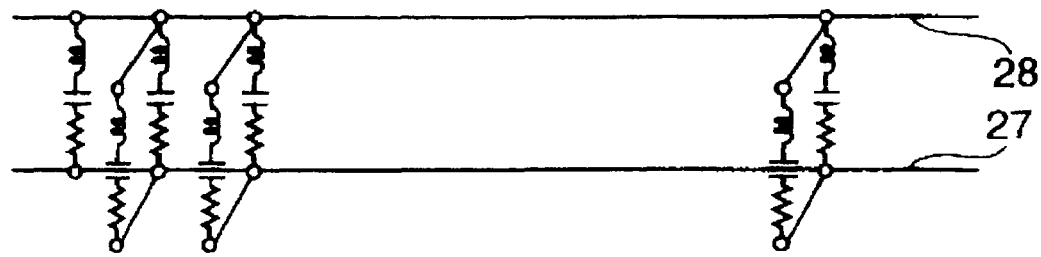
FIG. 16A is a circuit diagram simply showing an equivalent circuit of the printed-circuit board characteristic evaluation system of the embodiment 2.
Figure 16B:
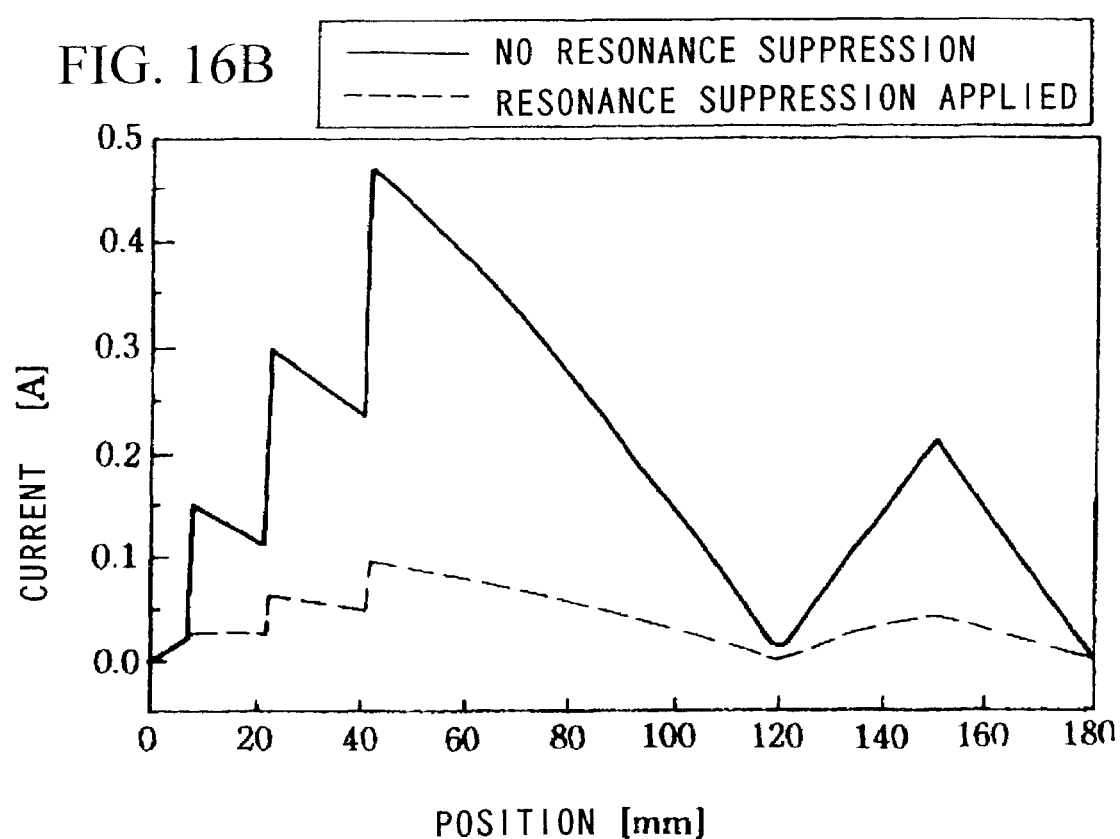
FIG. 16B is a graph showing distributions of electric currents in the power supply circuit of the system of the embodiment 2 under the prescribed condition.

FIGS. 15B, 16B are graphs showing characteristic curves which are created with respect to electric voltage and current in the power supply circuit when a sine wave signal of the resonance frequency 230 MHz is input to the power terminal connecting position of the receiver IC23. Specifically, a "solid" curve shown in FIG. 15B represents a calculation result with respect to voltage distribution in the power supply circuit, while a "solid" curve shown in FIG. 16B represents a calculation result with respect to current distribution in the power supply circuit. Herein, the sine wave signal is produced by the series circuit in which a voltage source of 1V and a resistor of 10Ω are connected together in series. Incidentally, "dotted" curves shown in FIGS. 15B, 16B will be explained later in embodiment 3.

FIG. 15B shows that the voltage becomes large at a right side of the board, and FIG. 16B shows that the current becomes maximal at a certain position which is apart from a left end of the board by 50 mm. In short, the first modified example is capable of specifying positions at which the voltage and/or current become large due to the resonance. In other words, it is possible to detect positions, which are suited for resonance suppression.

Next, a description will be given with respect to a second modified example of the present embodiment, which is designed by adding a second calculation function to the calculation block 12 shown in FIG. 6 with reference to FIG. 17.

Overall operations of the second modified example are basically similar to the foregoing steps used in the present embodiment. So, the second calculation function will be described using a flowchart of FIG. 17, which follows the aforementioned step S15 shown in FIG. 2. That is, after the step S15 in which the calculation result of the impedance characteristic of the power supply circuit is displayed, the present system proceeds to step S39, wherein using an equivalent circuit model corresponding to circuitry being formed between the power terminal and ground terminal of the active component, a time-base wave is input to the power supply circuit. In step S40, the present system performs calculations to produce waves of electric current and voltage at each of points in the power supply circuit. In step S41, the system outputs (or displays) calculation results and clearly indicates positions at which amplitudes of the waves of the electric current and voltage become large. In addition, FIG. 17 does not show the specifics in which the aforementioned waves are subjected to Fourier transform. Thus, the system further displays current distribution or voltage distribution with respect to specific frequency components corresponding to large amplitudes of the waves, for example.

Thus, it is possible to detect behaviors (or actions) of the electric current and voltage at each of the points in the power supply circuit which is operating. In addition, it is possible to detect frequencies at which the electric current and voltage become large or magnitudes of the electric current and voltage which are large in the power supply circuit which is operating. Based on the detected magnitudes of the electric current and voltage in the power supply circuit, it is possible to make a quantitative decision as to whether specific measures for resonance suppression should be performed or not.

[C] EMBODIMENT 3

Figure 18:
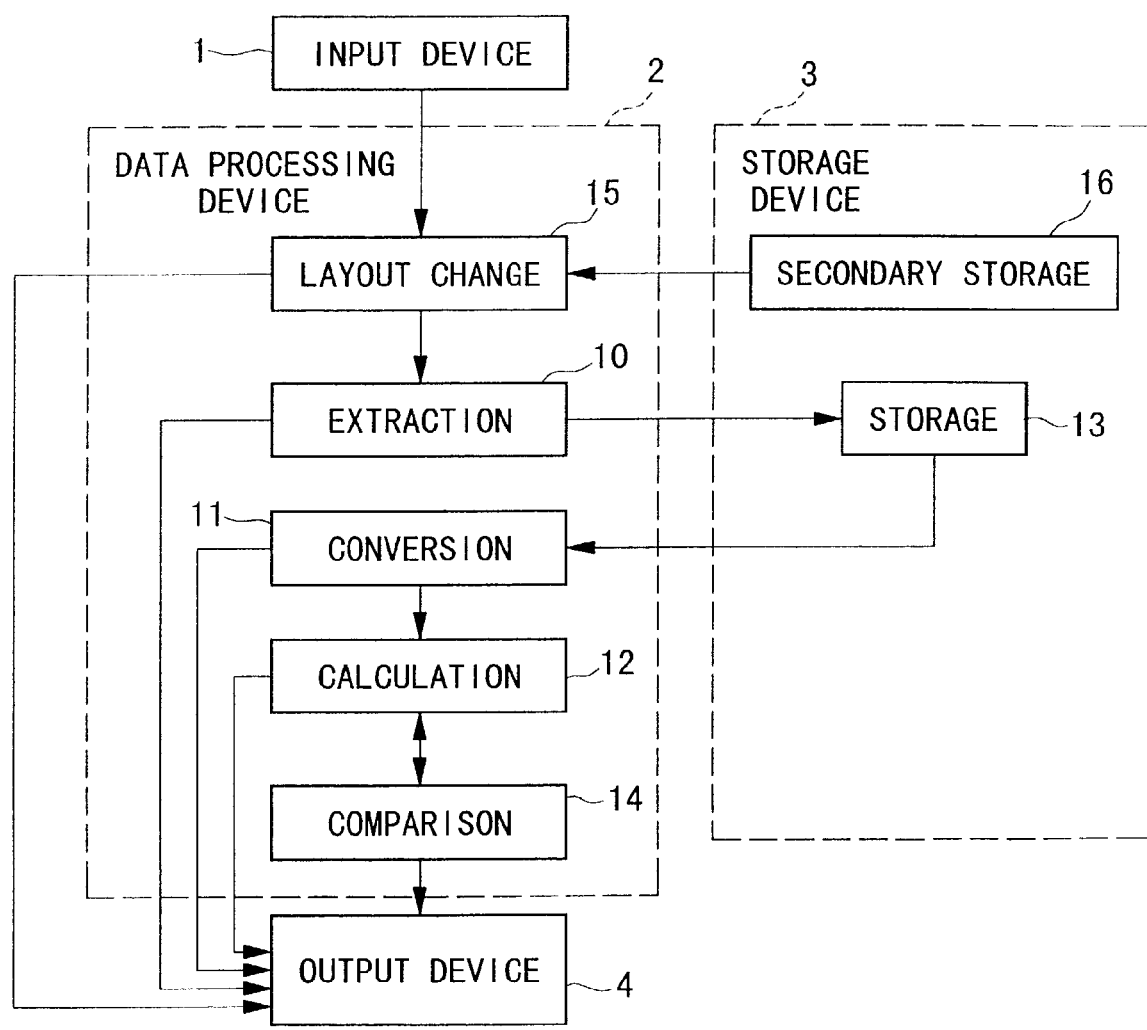
FIG. 18 is a block diagram showing a configuration of a printed-circuit board characteristic evaluation system in accordance with embodiment 3 of the invention.

FIG. 18 is a block diagram showing a configuration of a printed-circuit board characteristic evaluation system in accordance with embodiment 3 of the invention.

As compared with the aforementioned system of the embodiment 2 shown in FIG. 6, the present system of the embodiment 3 is characterized by further incorporating a layout change block 15 and a secondary storage block 16, which are respectively installed in the data processing device 2 and the storage device 3. Using the layout change block 15, it is possible to change overall layout information of the board. The present embodiment uses the layout change block 15 mainly for changing a layout of the power supply circuit. The secondary storage block 16 stores a program and data regarding a resonance suppression technique for suppressing resonance of the power supply circuit in advance.

Figure 19:
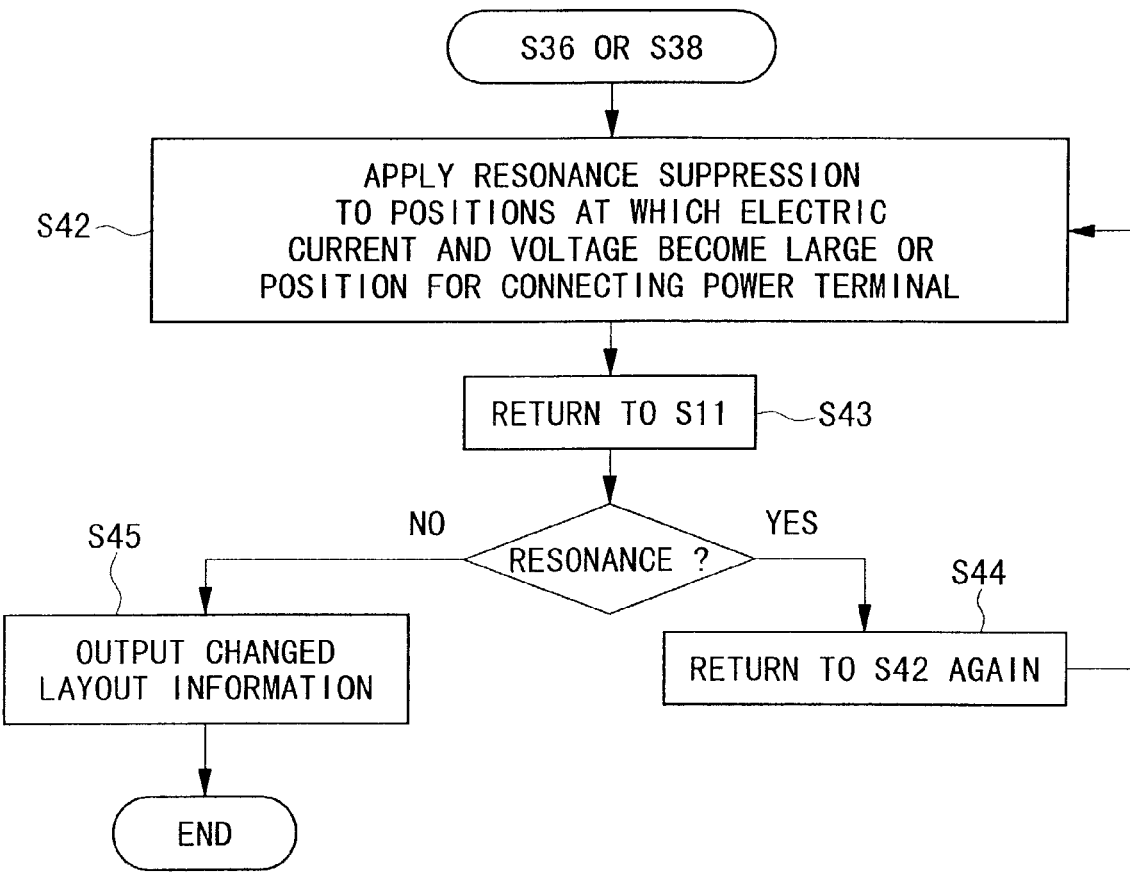
FIG. 19 is a flowchart showing additional operations being executed after the operations used in the foregoing embodiments in accordance with the embodiment 3 of the invention.

Next, operations of the present system will be described with reference to a flowchart of FIG. 19.

Overall operations of the present system are basically similar to the foregoing steps of the embodiment 2 and its modified examples. That is, steps of the flowchart of FIG. 19 are provided to follow the foregoing step S36 shown in FIG. 13 (or step S38 shown in FIG. 14) in which when a sine wave signal of a certain resonance frequency is input to a designated power terminal connecting position, values of electric current and voltage are calculated with respect to each of the points in the power supply circuit. Then, the present system proceeds to step S42, wherein the resonance suppression technique stored in the secondary storage block 16 is applied to the point of the power supply circuit at which the electric current and voltage become large or the power terminal connecting position.

In step S43, the present system reverts control back to the foregoing step S11 (see FIG. 2), so that its following steps are being performed in connection with the power supply circuit whose layout is changed. That is, the present system starts the step S11 again to extract layout information data regarding the power supply circuit. Then, the present system performs a series of the foregoing steps and lastly performs a certain step (e.g., step S23, S28 or S33 shown in FIG. 7, 9 or 11) for making a decision as to whether resonance is caused to occur in the power supply circuit or not.

If the present system determines that the resonance occurs in the power supply circuit, it transfers control to step S44, from which it transfers control back to the step S42 again. That is, the present system uses the layout change block 15 to change the layout of the power supply circuit again. Herein, changing the layout of the power supply circuit is repeated until the present system determines that no resonance occurs in the power supply circuit. If the present system determines that no resonance occurs in the power supply circuit, it transfers control to step S45. In step S45, the system outputs "changed" layout information representing an overall layout of the board being changed. Herein, the changed layout information is output from the layout change block 15 by means of the output device 4. Thus, it is possible to obtain the layout information of the board in which the power supply circuit is optimally designed.

Figure 20:
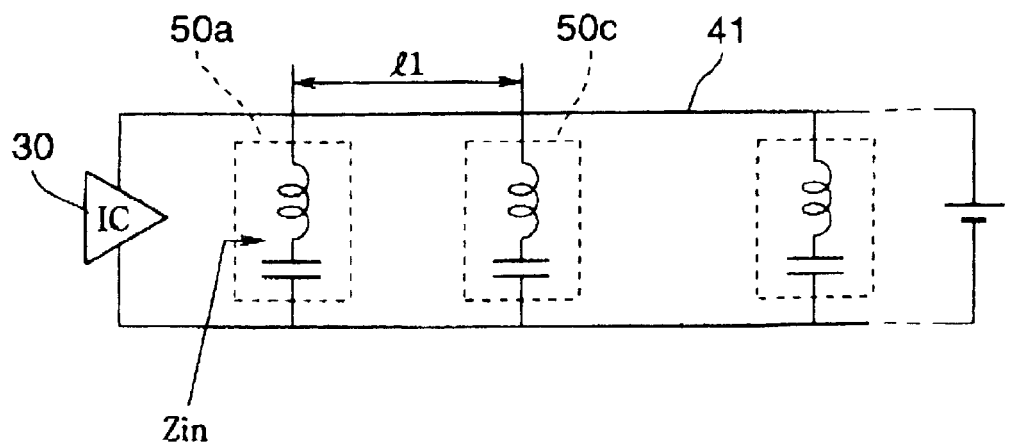
FIG. 20 is a circuit diagram showing an equivalent circuit model of a power supply circuit, which is used to explain a resonance suppression technique employed by the system of the embodiment 3.

According to the resonance suppression technique stored in the secondary storage block 16, a low-impedance component such as a capacitor is installed at a certain location of the power supply circuit at which a value of electric voltage is relatively large but a value of electric current is relatively small, for example. FIG. 20 shows an example of an equivalent circuit of the power supply circuit to which the resonance suppression technique is applied. Herein, resonance suppression is effected by providing two decoupling capacitors 50a, 50c, which are connected together by way of a line (or lines) 41 having a length "l1", in connection with the power terminal connecting position of the active component. Incidentally, it is known that resonance can be suppressed in a "problem" frequency range which are significant in radiation of unwanted electromagnetic waves by setting the length "l1" of the line 41 to match with a quarter wavelength of an upper-limit frequency in such a problem frequency range in radiation of unwanted electromagnetic waves. Details of such a resonance suppression technique are described in the specification of Japanese Patent Application No. Hei 10-184469, which is published in Japan as Japanese Unexamined Patent Publication No. 2000-22287 (or P2000-22287A) and which also corresponds to U.S. patent application Ser. No. 09/340,053 filed on Jun. 28, 1999, for example.

Figure 21:
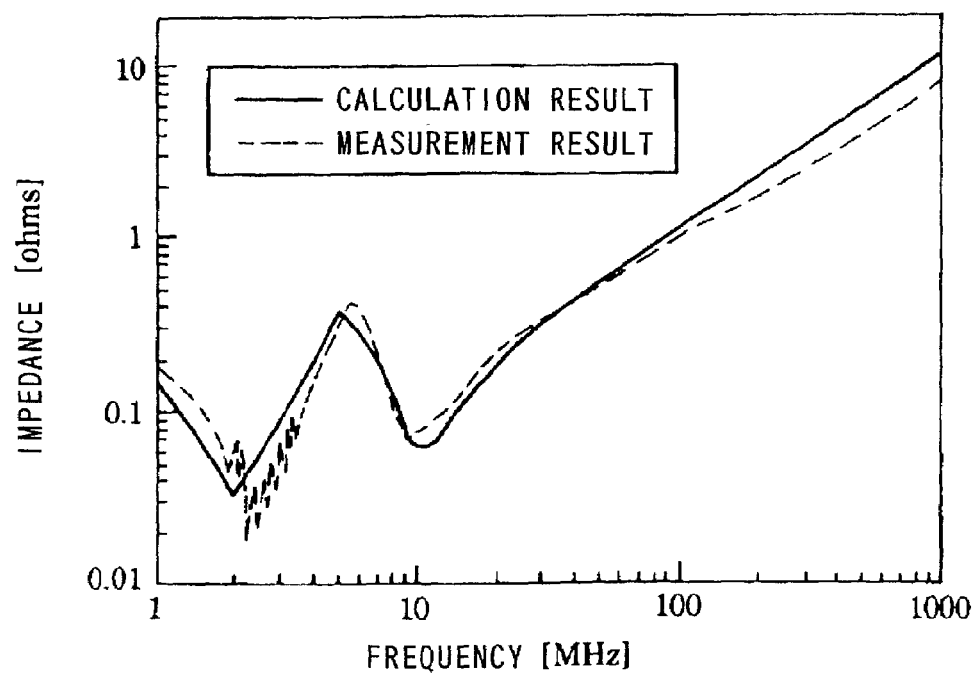
FIG. 21 is a graph showing impedance characteristics of the power supply circuit in the system of the embodiment 3.

FIG. 21 shows impedance characteristics with respect to the power supply circuit of the board in which the aforementioned resonance suppression technique shown in FIG. 20 is effected on all of the active components. Namely, the impedance characteristics shown in FIG. 21 are given in view of a position of a receiver IC 30. Incidentally, the line 41 having the length l1 and the decoupling capacitor 50c are arranged in the first layer of the board shown in FIGS. 3A, 3B. FIG. 21 shows two characteristic curves, i.e., a solid characteristic curve given by calculation result and a dotted characteristic curve given by measurement result. FIG. 21 shows that resonance remains at a frequency of 6 MHz although the resonance suppression technique is effected on the power supply circuit. Recently, engineers and scientists recognize that a frequency range between 30 MHz and 1 GHz is a problem frequency range in radiation of unwanted electromagnetic waves. So, it can be said that the resonance suppression technique is effective because no resonance is caused to occur in such a problem frequency range. That is, it is confirmed that the resonance suppression technique is effective to actually suppress the resonance. In addition, FIG. 21 shows that the solid characteristic curve representing the calculation result well matches with the dotted characteristic curve representing the measurement result. This indicates validity of the present invention.

Incidentally, dotted characteristic curves shown in FIGS. 15B, 16B show distributions of electric voltage and current at each of points in the power supply circuit to which the resonance suppression technique is applied. As compared with the solid characteristic curves which are created without applying the resonance suppression technique to the power supply circuit, the dotted characteristic curves show that both of the electric voltage and current are suppressed in amplitude. Results of FIGS. 15B, 16B show that the resonance suppression technique can be applied to the aforementioned embodiment(s) and its validity is confirmed.

Figure 22A:
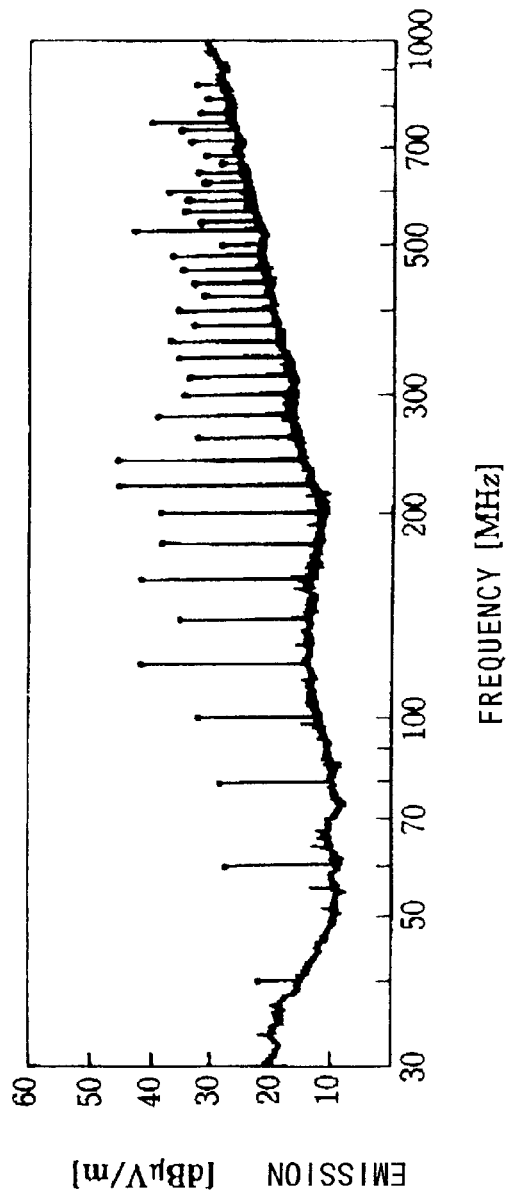
FIG. 22A is a graph showing a radiated emission characteristic being measured without applying the resonance suppression technique to the power supply circuit.
Figure 22B:
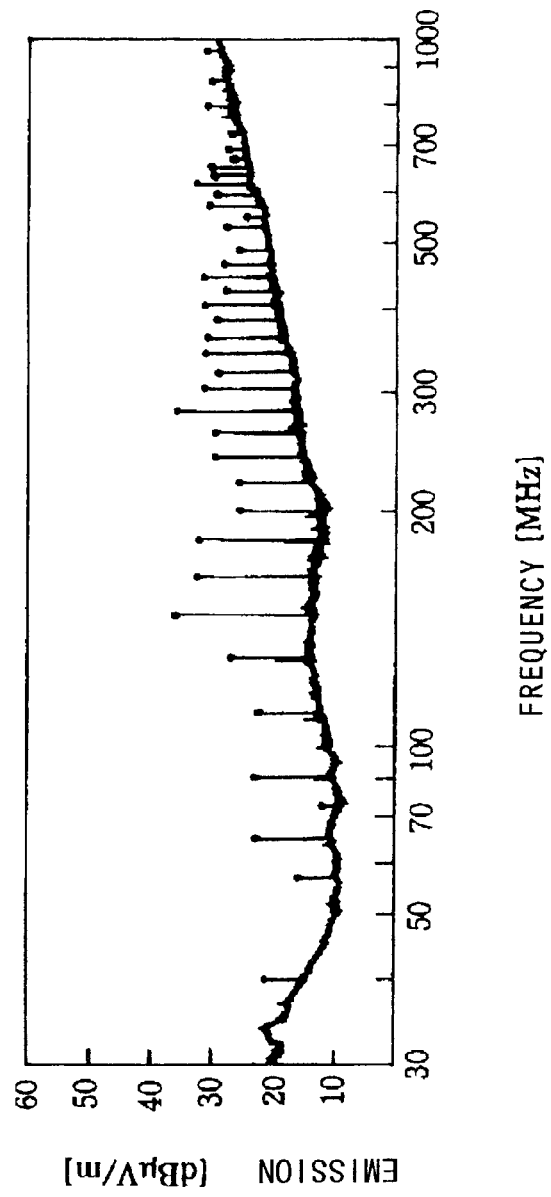
FIG. 22B is a graph showing a radiated emission characteristic being measured with applying the resonance suppression technique to the power supply circuit.
Figure 23:
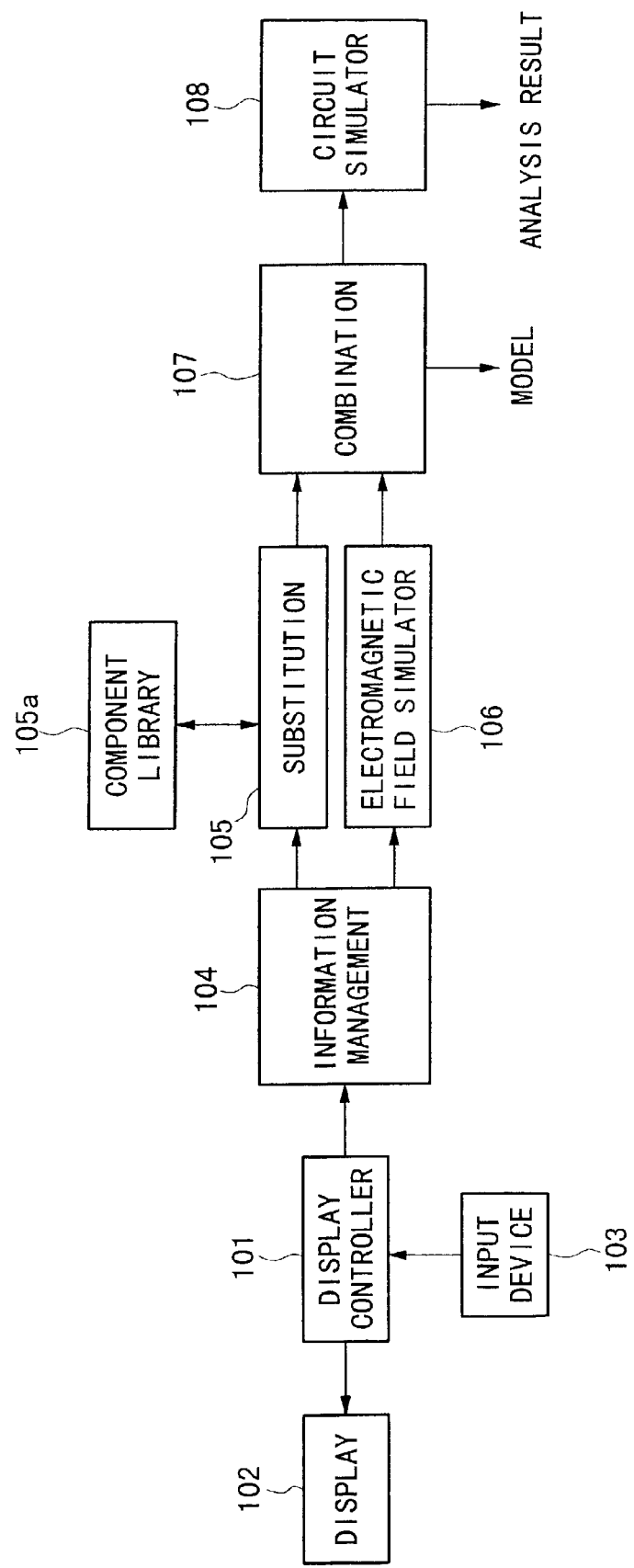
FIG. 23 is a block diagram showing an example of a transmission line simulator conventionally known.
Figure 24:
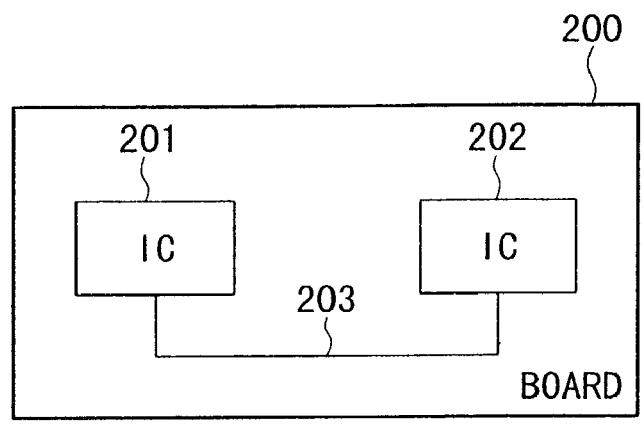
FIG. 24 is a schematic diagram showing an example of circuitry installed on a printed-circuit board.
Figure 25A:
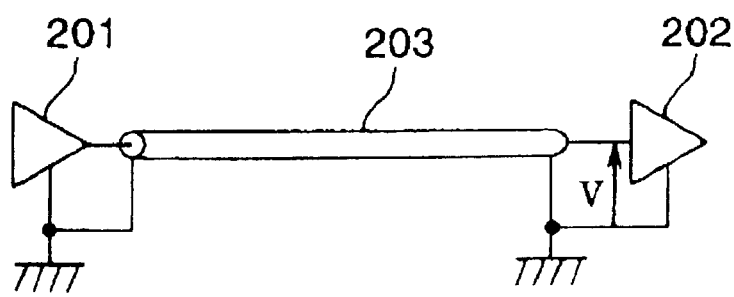
FIG. 25A is a simplified circuit diagram showing an example of an analysis model corresponding to circuitry being initially formed on a printed-circuit board.
Figure 25B:
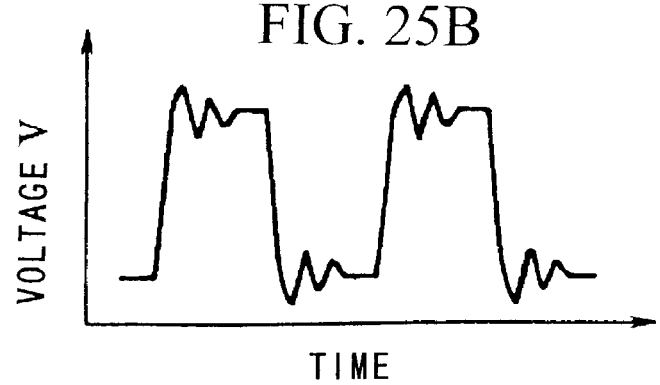
FIG. 25B is a graph showing an analysis result of the circuitry of FIG. 25A.
Figure 26A:
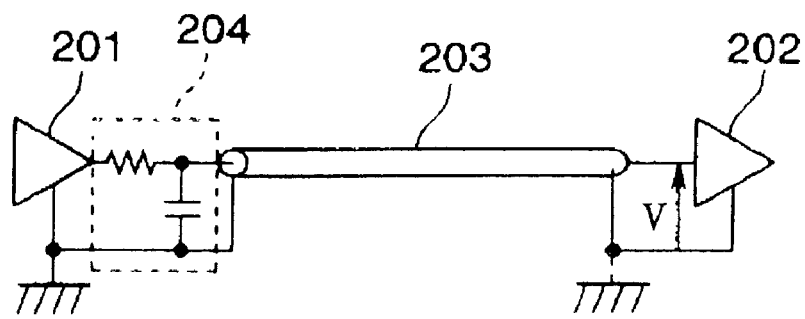
FIG. 26A is a simplified circuit diagram showing an example of an analysis model corresponding to circuitry which is improved in electric characteristics as compared with the circuitry of FIG. 25A.
Figure 26B:
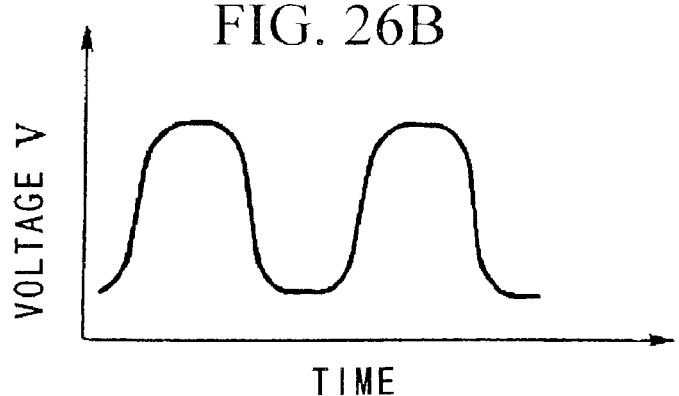
FIG. 26B is a graph showing an analysis result of the circuitry of FIG. 26A.
Figure 27:
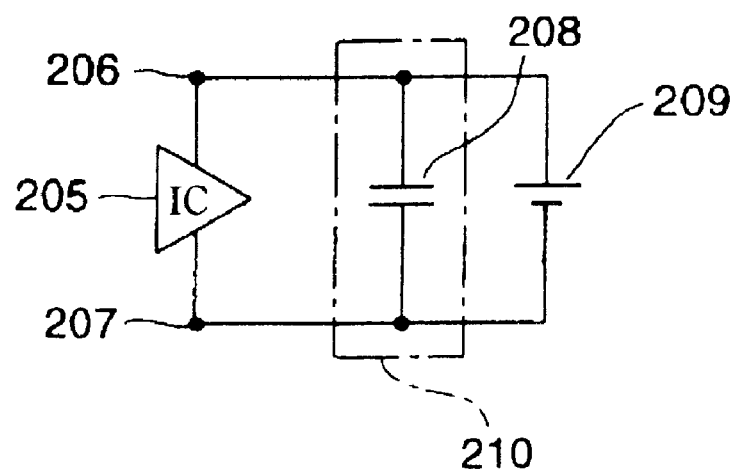
FIG. 27 is a circuit diagram showing an example of an equivalent circuit, which is made in connection with a power supply circuit.
Figure 28:
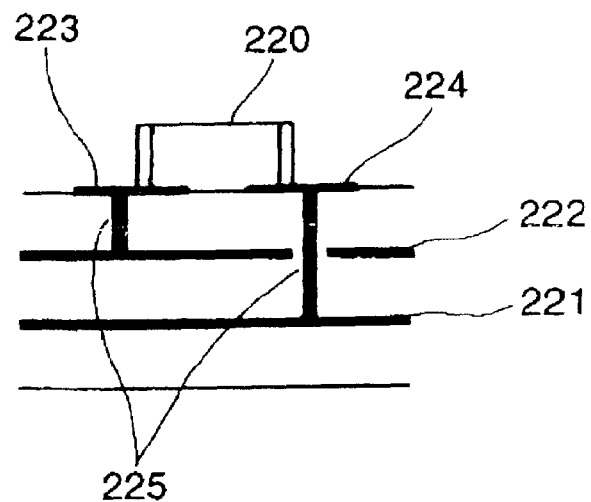
FIG. 28 is a sectional view showing a simplified construction of a decoupling capacitor being formed on a board.
Figure 29:
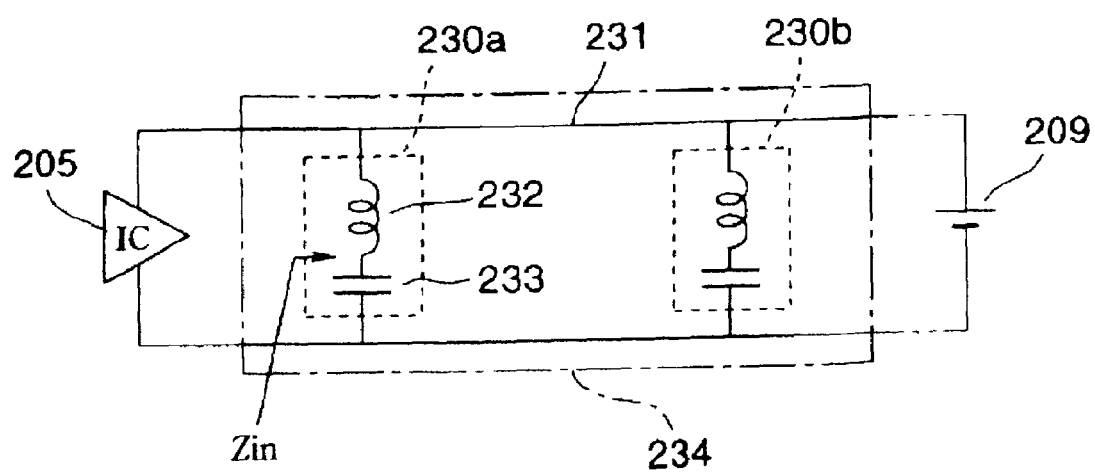
FIG. 29 is a circuit diagram showing an equivalent circuit of the power supply circuit, which is connected between an IC and a DC power source.
Figure 30:
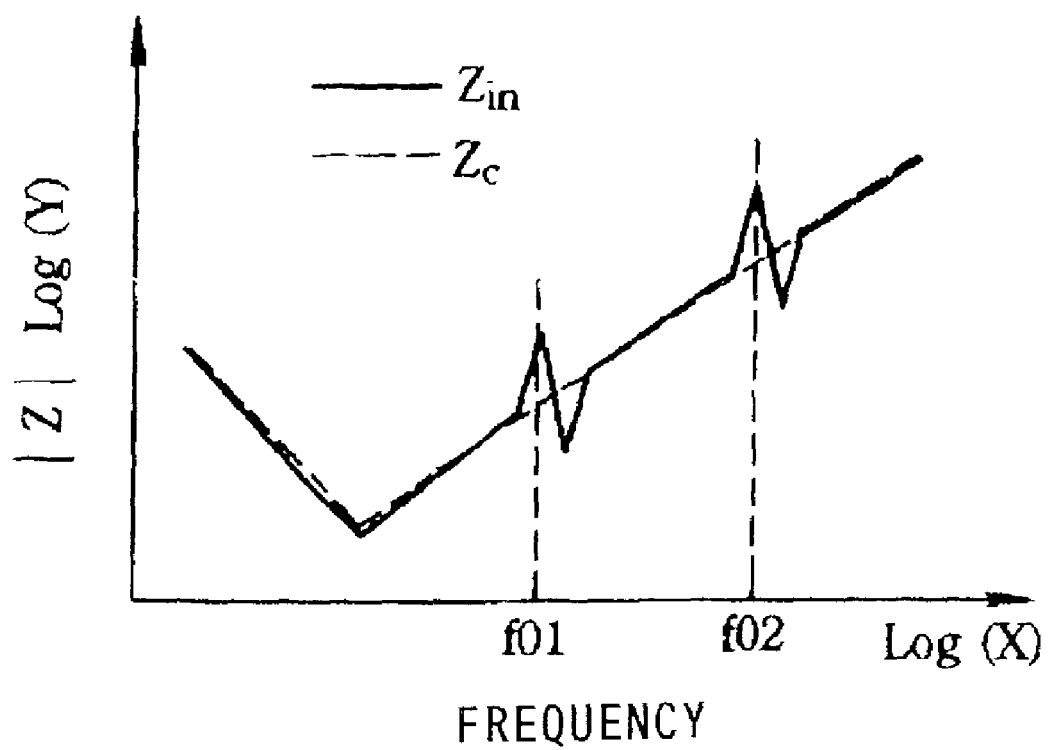
FIG. 30 is a graph showing impedance characteristics with regard to the power supply circuit.

FIGS. 22A, 22B show measurement results of radiation field characteristics. Namely, FIG. 22A shows a radiated emission characteristic being measured without application of the resonance suppression technique, and FIG. 22B shows a radiated emission characteristic being measured with application of the resonance suppression technique. Incidentally, measurement is performed in a "dark room" in electric waves in which a floor surface is made by a metal plate (or metal plates) and a wave absorber (or wave absorbers) are installed. Herein, a board which is a subject being measured is arranged in parallel with the floor surface on a desk which is made of wood material and has a height of 75 cm. In addition, an antenna is arranged at a certain position being apart from the board by 3 m. Circuitry on the board is driven by a quartz oscillator of 20 MHz. The aforementioned resonance suppression technique shown in FIG. 20 is used to suppress resonance being caused to occur in the circuitry on the board.

Comparison between the radiated emission characteristics of FIGS. 22A, 22B shows that emission levels are being reduced substantially in overall frequency ranges. Particularly, emission levels are reduced by 15 dB at frequencies that lie in proximity to the aforementioned resonance frequencies of 230 MHz and 510 MHz at which resonance is caused to occur conventionally. In short, the following points of the present invention are well supported by results of FIGS. 22A, 22B.

i) It is possible to discriminate occurrence of resonance which is caused to occur in the power supply circuit and which is a cause of radiation of electromagnetic waves.

ii) It is possible to apply the resonance suppression technique, which well suppresses resonance being caused to occur in circuitry on the board.

As described above, the present embodiment is capable of providing the resonance suppression technique and is capable of changing a layout of circuitry on the board in accordance with the resonance suppression technique. Thus, it is possible to confirm validity of the resonance suppression technique.

The embodiments described heretofore are actualized mainly by hardware systems. However, the present invention is not necessarily actualized by the hardware systems. That is, it is possible to actualize functions and methods in evaluation of characteristics of printed-circuit boards by software processing corresponding to computer programs. In that case, the functions and methods are provided by means of storage media storing the computer programs.

Lastly, the present invention has a variety of technical features and effects, which are summarized as follows:

(1) It is possible to calculate impedance characteristics with respect to power supply circuits by using layout information of boards. Therefore, during or after creation of layouts of boards which are not actually manufactured, it is possible to make evaluation as to whether the power supply circuit is designed to have sufficiently low impedance or not, and it is possible to make evaluation as to whether resonance is caused to occur in the power supply circuit being designed or not.

(2) It is possible to grasp distributions of electric current and voltage in the power supply circuit before manufacture of the board. Based on the distributions of electric current and voltage, it is possible to detect a cause of resonance being caused to occur in the power supply circuit, and it is possible to locate a position which is optimal in application of the resonance suppression technique.

(3) It is possible to provide the appropriate resonance suppression technique in advance, and it is possible to change a layout of circuitry on the board in accordance with the resonance suppression technique. So, it is possible to confirm validity of the resonance suppression technique.

(4) It is possible to output layout information of the board which is optimally designed. Thus, it is possible to design and manufacture the printed-circuit board in which stable operations of active components are guaranteed and radiation of electromagnetic waves is suppressed.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A printed circuit board characteristic evaluation method comprising the steps of:

providing layout information data regarding a power supply circuit on a printed circuit board on which at least one active component, which is an active switching device, is installed; and performing calculation based on the layout information data to produce an impedance characteristic of the power supply circuit, as observed from a power terminal connecting position at which the power supply circuit is connected to the active component installed on the printed circuit board.

2. Storage media storing programs and data that cause a computer system to perform a printed-circuit board characteristic evaluation method comprising steps of:

providing layout information data regarding a power supply circuit on a printed circuit board on which at least one active component, which is an active switching device, is installed; and performing calculation based on the layout information data to produce an impedance characteristic of the power supply circuit, as observed from a power terminal connecting position at which the power supply circuit is connected to the active component installed on the printed circuit board.

* * * * *